US008432730B2

(12) United States Patent
Uochi et al.

(10) Patent No.: US 8,432,730 B2
(45) Date of Patent: Apr. 30, 2013

(54) SEMICONDUCTOR DEVICE AND METHOD FOR DRIVING THE SAME

(75) Inventors: Hideki Uochi, Kanagawa (JP); Koichiro Kamata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 79 days.

(21) Appl. No.: 13/185,840

(22) Filed: Jul. 19, 2011

(65) Prior Publication Data

US 2012/0026787 A1 Feb. 2, 2012

(30) Foreign Application Priority Data

Jul. 28, 2010 (JP) ................... 2010-169598

(51) Int. Cl.
*G11C 11/34* (2006.01)
(52) U.S. Cl.
USPC .......................................... 365/163; 257/38
(58) Field of Classification Search .................. 365/163; 257/38
See application file for complete search history.

(56) References Cited

U.S. PATENT DOCUMENTS

| 4,466,081 | A | 8/1984 | Masuoka |
| 5,280,446 | A * | 1/1994 | Ma et al. .................. 365/185.15 |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,538,916 | B2 | 3/2003 | Ohsawa |
| 6,563,174 | B2 | 5/2003 | Kawasaki et al. |
| 6,687,152 | B2 | 2/2004 | Ohsawa |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,115,941 | B2 | 10/2006 | Kato |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Hoai V Ho
(74) *Attorney, Agent, or Firm* — Fish & Richardson P.C.

(57) ABSTRACT

A transistor includes first and second control gates, and a storage gate. The storage gate is made to be a conductor, supplied with a specific potential, and then made to be an insulator, thereby holding the potential. Data is written by making the storage gate a conductor, supplying a potential of data to be stored, and making the storage gate an insulator. Data is read by making the storage gate an insulator, supplying a potential to a read signal line connected to one of a source and a drain of the transistor, supplying a potential for reading data to the first control gate, and then detecting a potential of a bit line connected to the other of the source and the drain.

9 Claims, 11 Drawing Sheets

U.S. PATENT DOCUMENTS

| | | | |
|---|---|---|---|
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,550,334 | B2 | 6/2009 | Kato et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2003/0231528 | A1* | 12/2003 | Choi et al. ............... 365/199 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0095786 | A1 | 5/2005 | Chang et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-324857 A | 11/2002 |
| JP | 2003-086000 A | 3/2003 |
| JP | 2003-086808 A | 3/2003 |
| JP | 2004-103957 A | 4/2004 |
| JP | 2004-200377 A | 7/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room emperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phast relations in the In2O3-Ga2ZnO4-ZnO system at 1350° C," Journal of Solid State Chemistry, Aug. 1, 1991, vol. 93, No. 2, pp. 298-315.

Nomura, K et al., "Thin Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) ,2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size Amoled." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Ai2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

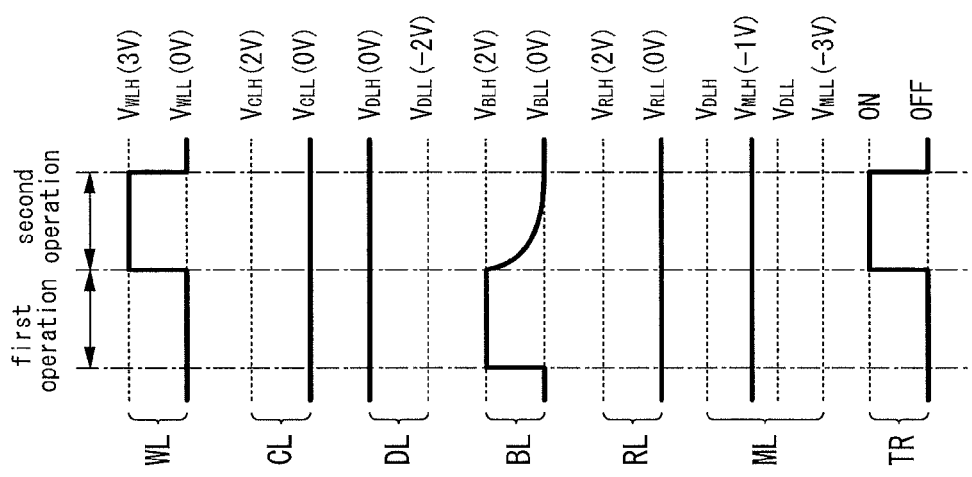
FIG. 3A timing chart of a write operation
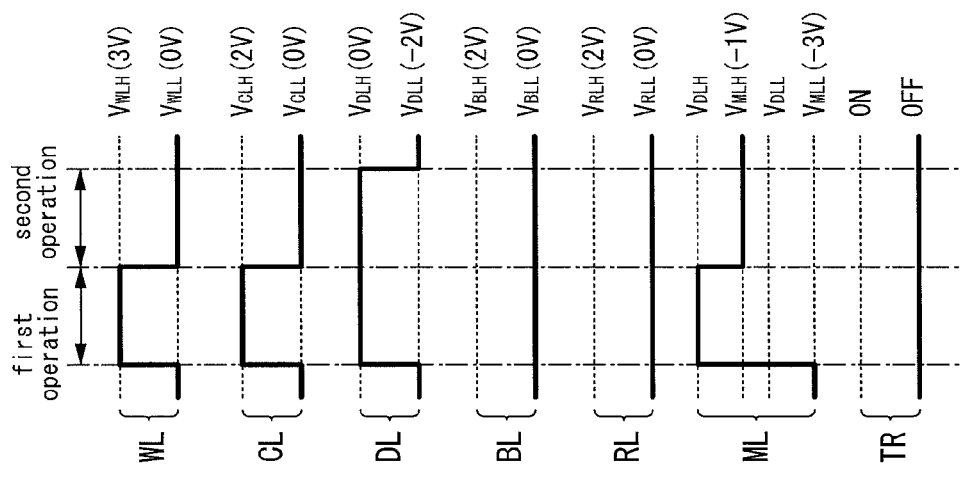
FIG. 3B timing chart of a read operation

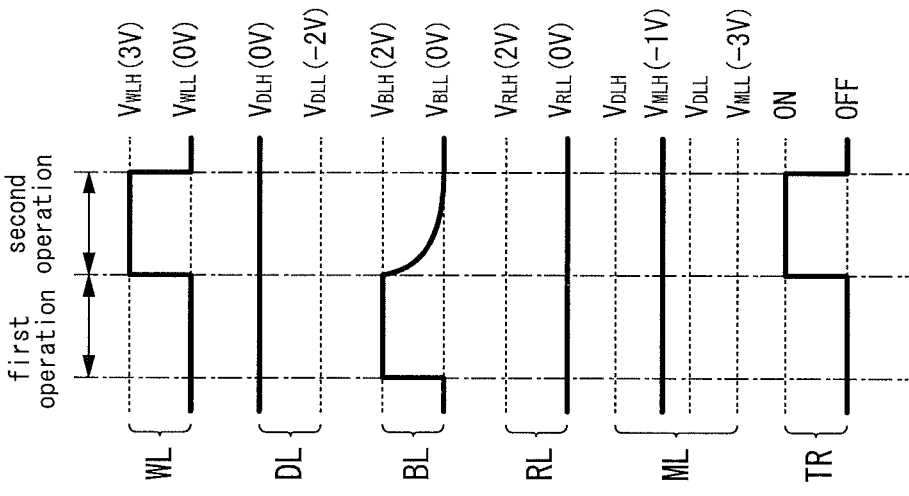
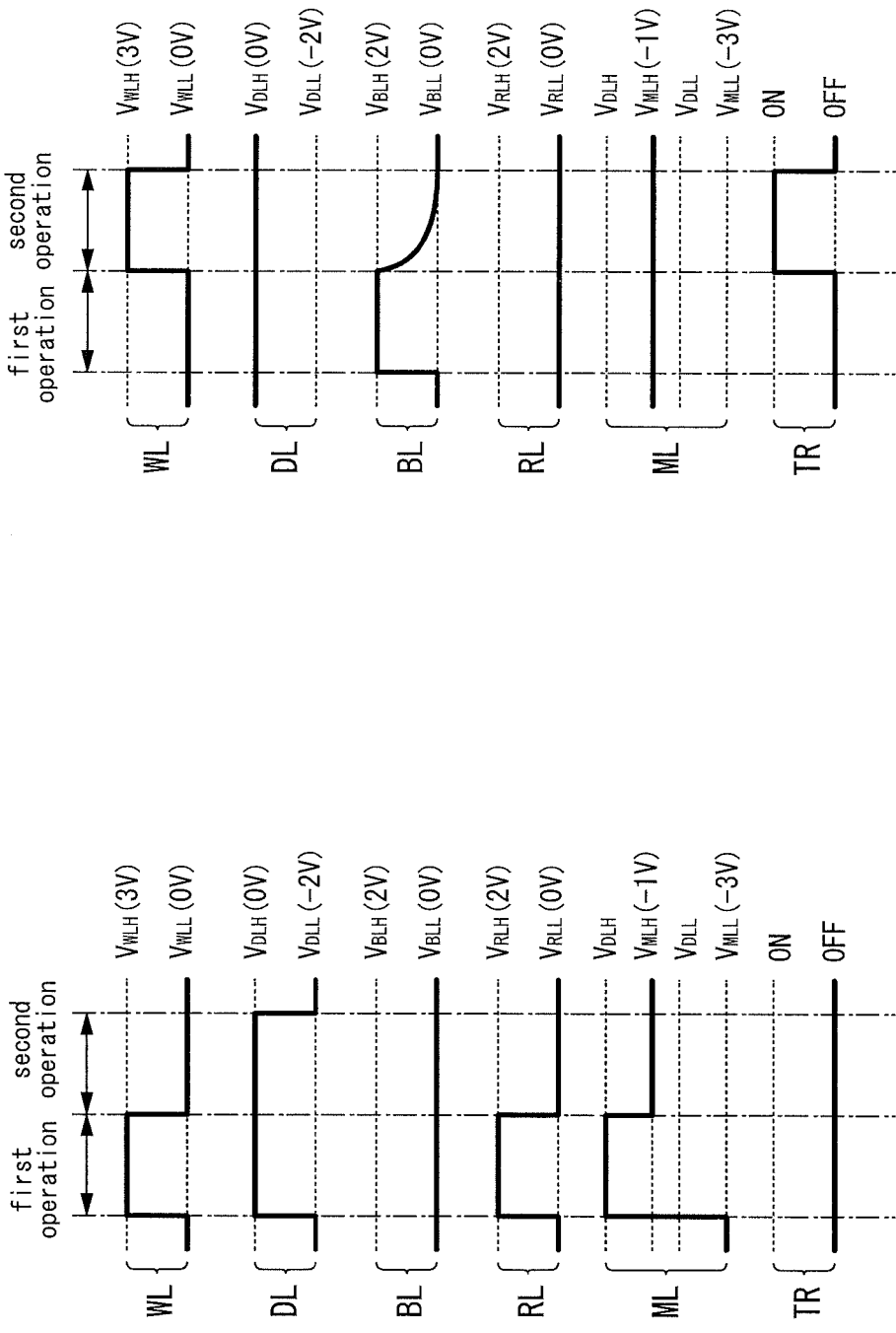
FIG. 9A  timing chart of a write operation
FIG. 9B  timing chart of a read operation

SEMICONDUCTOR DEVICE AND METHOD FOR DRIVING THE SAME

BACKGROUND OF THE INVENTION

1. Field of the Invention

The invention disclosed herein relates to a semiconductor device using a semiconductor element, a method for manufacturing the semiconductor device, and a method for driving the semiconductor device.

In this specification, a semiconductor device refers to any device that can function by utilizing semiconductor properties. A semiconductor circuit, a storage device, an imaging device, a display device, an electro-optical device, an electronic device, and the like are all semiconductor devices.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data (information) in such a manner that a transistor included in a storage element is selected and electric charge is stored in a capacitor.

When data is read from a DRAM, electric charge in a capacitor is lost on the above principle; thus, another write operation is necessary every time data is read. Moreover, a transistor included in a storage element has a leakage current and electric charge flows into or out of a capacitor even when the transistor is not selected, so that the data retention time is short. For that reason, another write operation (refresh operation) is necessary at predetermined intervals, and it is difficult to sufficiently reduce power consumption of the storage element. Furthermore, since stored data is lost when power supply stops, an additional storage device using a magnetic material or an optical material is needed in order to retain the data for a long time.

Another example of a volatile storage device is an SRAM (static random access memory). An SRAM retains data by using a circuit such as a flip-flop and thus does not need a refresh operation. This means that an SRAM has an advantage over a DRAM. However, cost per storage capacity is increased because of the use of a flip-flop or the like. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data retention time is extremely long (almost permanent) and a refresh operation which is necessary in a volatile storage device is not needed (e.g., see Patent Document 1).

However, a gate insulating layer included in a storage element deteriorates by tunneling current generated in writing, so that the storage element stops its function after a limited number of write operations. In order to reduce adverse effects of this problem, a method of equalizing the number of write operations for storage elements is employed, for example, in which case a complicated peripheral circuit is needed. Moreover, employing such a method does not solve the problem of lifetime. In other words, a flash memory is not suitable for applications in which data is frequently rewritten.

In addition, high voltage is necessary to inject electric charge in the floating gate or to remove the electric charge, and a circuit for generating high voltage is also necessary. Further, it takes a relatively long time to perform an operation for injecting or removing electric charge, so that it is not easy to increase the speed of write and erase operations.

REFERENCE

Patent Document

[Patent Document 1] Japanese Published Patent Application No. S57-105889

SUMMARY OF THE INVENTION

In view of the foregoing problems, an object of one embodiment of the invention disclosed herein is to provide a semiconductor device with a novel structure in which stored data can be retained even when power is not supplied, and there is no limitation on the number of write cycles.

Another object is to provide a semiconductor device with high integration and large storage capacity.

Another object is to provide a highly reliable semiconductor device with high stability in operation.

Another object is to provide a semiconductor device capable of high-speed operation.

Another object is to provide a semiconductor device with low power consumption.

Each embodiment of the invention disclosed in this specification achieves at least one of the above objects.

In one embodiment of the invention disclosed herein, a storage gate including an oxide semiconductor is provided in a transistor. The storage gate is made to be a conductor (the storage gate becomes n-type), and a specific potential is supplied to the storage gate. After that, the storage gate is made to be an insulator to hold the potential (electric charge).

One embodiment of the present invention is a semiconductor device which has a data line and a transistor including a first gate, a second gate, a third gate that includes an oxide semiconductor, and a semiconductor layer including a channel formation region. In the semiconductor device, the first gate is placed to overlap with the channel formation region with the third gate provided therebetween; the third gate includes a region and an offset region, the region overlapping with the channel formation region, and the offset region extending beyond an edge of the first gate and being connected to the data line; and the second gate is placed to overlap with the offset region.

The second gate is placed to overlap with the edge of the first gate, the offset region, and an edge of the data line.

One embodiment of the present invention is a semiconductor device which has a transistor including a first control gate, a second control gate, a storage gate, and a semiconductor layer including a channel formation region; a word line; a data line; a control line; a read signal line; and a bit line. In the semiconductor device, the first control gate is connected to the word line; the second control gate is connected to the control line; the storage gate is connected to the data line; one of a source and a drain of the transistor is connected to the read signal line; the other of the source and the drain is connected to the bit line; the first control gate is placed to overlap with the channel formation region with the storage gate provided therebetween; the storage gate includes a region and an offset region, the region overlapping with the channel formation region, and the offset region extending beyond an edge of the first control gate and being connected to the data line; and the second control gate is placed to overlap with the offset region.

The second control gate is placed to overlap with the edge of the first control gate, the offset region, and an edge of the data line.

One embodiment of the present invention is a semiconductor device that includes a memory cell including a transistor having a first gate, a second gate, and a third gate including an oxide semiconductor, a first wiring, a second wiring, a fourth wiring, and a fifth wiring. The first gate is electrically connected to the first wiring. The second gate is electrically connected to the fifth wiring. The third gate is electrically connected to the second wiring. One of a source and a drain of the transistor is electrically connected to the fifth wiring. The other of the source and the drain of the transistor is electrically connected to the fourth wiring.

The third gate includes a region overlapping with the first gate, a region connected to the second wiring, and an offset region extending beyond an edge of the first gate to the region connected to the second wiring. The second gate is placed to overlap with the edge of the first gate, the region in which the third gate is connected to the second wiring, and the offset region of the third gate.

As the oxide semiconductor used for the storage gate or the third gate, an intrinsic (i-type) or substantially intrinsic oxide semiconductor is preferably used. An intrinsic oxide semiconductor (including an oxide semiconductor that becomes intrinsic by application of an electric field) has a sufficiently low carrier density (e.g., lower than $1\times10^{12}/cm^3$, or lower than $1.45\times10^{10}/cm^3$), and thus serves as an insulator.

An oxide semiconductor used for the storage gate or the third gate is not necessarily an intrinsic (i-type) or substantially intrinsic oxide semiconductor, and any oxide semiconductor that can become intrinsic by application of an electric field can be used.

Data can be stored in the following manner: a potential of data to be stored is applied to the oxide semiconductor used for the storage gate or the third gate when the oxide semiconductor is made to serve as a conductor by application of an electric field, and the potential is then held by making the oxide semiconductor intrinsic (making the oxide semiconductor an insulator).

The storage gate or the third gate is placed to overlap with a channel formation region in a semiconductor layer included in the transistor.

As a semiconductor for forming a channel of the transistor, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide.

When an oxide semiconductor is used as a semiconductor for forming the channel of the transistor, a transistor with an extremely low off-state current can be realized. Thus, a semiconductor device with lower power consumption can be provided.

In the above semiconductor device, data is written in the following manner: the potentials of the first control gate and the second control gate are set at potentials that make the storage gate a conductor (the storage gate becomes n-type), a potential to be stored in the memory cell is supplied to the storage gate, and the potentials of the first control gate and the second control gate are set at potentials that make the storage gate an insulator (intrinsic).

In the above semiconductor device, data is written in the following manner: the potential of the first wiring is set at a potential that makes the third gate a conductor, a potential to be stored in the third gate is supplied to the second wiring, and the potential of the first wiring is set at a potential that makes the third gate an insulator.

In the above semiconductor device, data is read in the following manner: the drain is supplied with (precharged with) electric charge for making the drain of the transistor have a first potential, a second potential is supplied to the source of the transistor, a potential for reading the data is supplied to the first control gate, and a change in the potential of the drain is detected.

In the above semiconductor device, data is read in the following manner: the fourth wiring is supplied with (precharged with) electric charge for making the fourth wiring have a first potential, a second potential is supplied to the third wiring, a potential for reading the data is supplied to the first wiring, and a change in the potential of the fourth wiring is detected.

Note that in this specification and the like, a non-volatile semiconductor device indicates a semiconductor device that can retain data for a given period of time (at least $1\times10^4$ seconds or longer, preferably $1\times10^6$ seconds or longer) even when no power is supplied.

According to one embodiment of the present invention, the area of a semiconductor device can be reduced; thus, a semiconductor device with higher integration and larger storage capacity can be provided.

In addition, deterioration of a gate insulating layer hardly occurs because data writing does not need high voltage; thus, the number of write cycles and the reliability are greatly increased.

Further, an operation for erasing data is not needed, so that high-speed operation can be easily realized.

Data is stored by making an oxide semiconductor an insulator, so that the stored data can be retained for an extremely long time. In other words, a refresh operation becomes unnecessary or the frequency of refresh operations can be extremely low. Consequently, power consumption of the semiconductor device can be reduced. Moreover, stored data can be retained for a long time even when power is not supplied.

BRIEF DESCRIPTION OF THE DRAWINGS

In the accompanying drawings:

FIGS. 3A and 3B are timing charts illustrating operations of a semiconductor device;

FIGS. 9A and 9B are timing charts illustrating operations of a semiconductor device;

DETAILED DESCRIPTION OF THE INVENTION

Figure 1A:
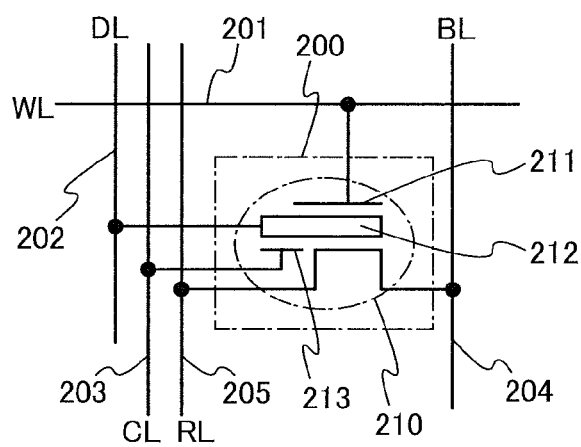
FIGS. 1A and 1B are circuit diagrams of a semiconductor device.

Examples of embodiments of the present invention will be described below with reference to the accompanying drawings. Note that the present invention is not limited to the description below, and it is easily understood by those skilled in the art that modes and details can be changed in various ways without departing from the spirit and scope of the present invention. Therefore, the present invention should not be construed as being limited to the following description of the embodiments.

The position, size, range, and the like of each component illustrated in drawings and the like are not accurately represented in some cases for easy understanding. Therefore, the disclosed invention is not necessarily limited to the position, size, range, and the like disclosed in the drawings and the like. In the drawings for explaining the embodiments, the same part or part having a similar function are denoted by the same reference numerals, and description of such part is not repeated.

In this specification and the like, ordinal numbers such as first, second, and third are used in order to avoid confusion between components, and the terms do not limit the number of components.

In addition, in this specification and the like, the terms "electrode" and "wiring" do not have functional limitations. For example, an "electrode" is sometimes used as part of a "wiring", and vice versa. Furthermore, the term "electrode" or "wiring" sometimes refers to a plurality of "electrodes" or "wirings" formed in an integrated manner.

Functions of a "source" and a "drain" are sometimes replaced with each other when a transistor of opposite polarity is used or when the direction of current flowing is changed in a circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of the object having any electric function are a switching element such as a transistor, a resistor, an inductor, a capacitor, and an element with a variety of functions as well as an electrode and a wiring.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and "potential" and "voltage" are used as synonymous words in many cases. Therefore, in this specification, "potential" can be replaced with "voltage" and vice versa, unless otherwise specified.

A transistor is one of a variety of semiconductor elements, and can amplify current or voltage and perform a switching operation for controlling conduction and non-conduction, for example. A transistor in this specification includes an insulated-gate field effect transistor (IGFET) and a thin film transistor (TFT) in its category.

Embodiment 1

In this embodiment, an example of a circuit configuration and an operation of a semiconductor device according to one embodiment of the disclosed invention will be described with reference to FIGS. 1A and 1B, FIGS. 2A and 2B, FIGS. 3A and 3B, and FIG. 4. In this embodiment, the case where an n-channel transistor (n-type transistor) is used will be described.

FIG. 1A illustrates a circuit configuration of a non-volatile memory cell 200 including a transistor 210. The transistor 210 has a first control gate 211, a storage gate 212, and a second control gate 213. In FIG. 1A, the first control gate 211 of the transistor 210 is electrically connected to a first wiring 201 (also referred to as a word line WL). The storage gate 212 of the transistor 210 is electrically connected to a second wiring 202 (also referred to as a data line DL). The second control gate 213 is electrically connected to a third wiring 203 (also referred to as a control line CL).

The first control gate 211 is placed to overlap with a channel formation region of the transistor 210 and part of the storage gate 212. The second control gate 213 is placed to overlap with a region of the storage gate 212 between the channel formation region of the transistor 210 and the second wiring 202.

One of a source and a drain of the transistor 210 is electrically connected to a fourth wiring 204 (also referred to as a bit line BL). The other of the source and the drain of the transistor 210 is electrically connected to a fifth wiring 205 (also referred to as a read signal line RL).

As a semiconductor for forming a channel of the transistor 210, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide. The transistor 210 including such a semiconductor material can operate at sufficiently high speed, so that stored data can be read at high speed, for example. In other words, high-speed operation of the semiconductor device can be realized.

Alternatively, an oxide semiconductor can be used as a semiconductor for forming the channel of the transistor 210. An oxide semiconductor has a wide energy gap of 3.0 eV or more. In a transistor obtained by processing an oxide semiconductor under appropriate conditions, the value of the leakage current per unit channel width (1 µm) between a source and a drain in the off state (that is, the off-state current value) at an operating temperature (e.g., at 25° C.) can be 100 zA/µm ($1 \times 10^{-19}$ A/µm) or lower or 10 zA/µm ($1 \times 10^{-20}$ A/µm) or lower, and further can be 1 zA/µm ($1 \times 10^{-21}$ A/µm) or lower. Thus, a semiconductor device with lower power consumption can be provided.

The storage gate 212 of the transistor 210 is formed using an oxide semiconductor. It is known that there are an oxide semiconductor that becomes n-type when an electric field is applied and an oxide semiconductor that becomes p-type when an electric field is applied. In this specification, the case of using an oxide semiconductor that becomes n-type when an electric field is applied will be described as an example. As an oxide semiconductor used for the storage gate 212, an intrinsic (i-type) or substantially intrinsic oxide semiconductor is preferably used.

An oxide semiconductor used for the storage gate 212 is not necessarily an intrinsic (i-type) or substantially intrinsic oxide semiconductor, and any oxide semiconductor that can become intrinsic by application of an electric field can be used. Note that the intrinsic (i-type) or substantially intrinsic oxide semiconductor is intrinsic without application of an electric field; therefore, in the case of using such an oxide semiconductor, circuit design can be easy and a semiconductor device with lower power consumption can be manufactured.

Figure 2A:
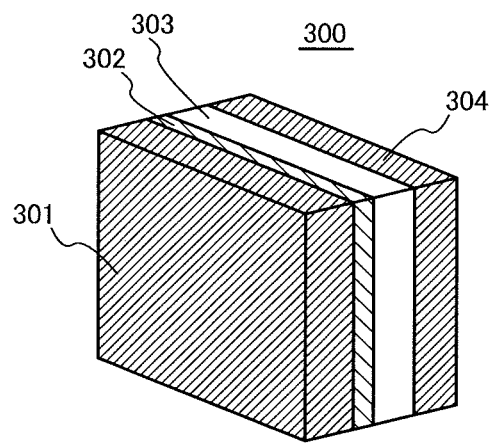
FIGS. 2A and 2B are diagrams explaining transient characteristics of a capacitor including an oxide semiconductor.

Here, measurement results of transient characteristics of a capacitor 300 that includes a stack of an insulator and an oxide semiconductor as a dielectric will be described with reference to FIGS. 2A and 2B. FIG. 2A is a schematic diagram illustrating a stacked structure of the measured capacitor 300.

The capacitor 300 includes an oxide semiconductor 302 and an insulator 303 between an electrode 301 and an electrode 304. The electrode 301 is in contact with the oxide semiconductor 302. The electrode 304 is in contact with the insulator 303. As the oxide semiconductor 302, an In—Ga—Zn-based oxide semiconductor with a thickness of 30 nm was used. As the insulator 303, 100-nm-thick silicon oxide was used. The overlap area of the electrode 301 and the electrode 304 was 1 mm$^2$.

The transient current was measured with Agilent 4156C Precision Semiconductor Parameter Analyzer (manufactured by Agilent Technologies, Inc.). The measurement was performed as follows. First, the value of a current flowing between the electrode 301 and the electrode 304 was measured for 60 seconds while the potential of the electrode 301 was set at 0 V and the potential of the electrode 304 was set at 2 V. Then, the value of a current flowing between the electrode 301 and the electrode 304 was measured for 60 seconds while the potential of the electrode 301 was set at 0 V and the potential of the electrode 304 was set at −2 V.

Figure 2B:
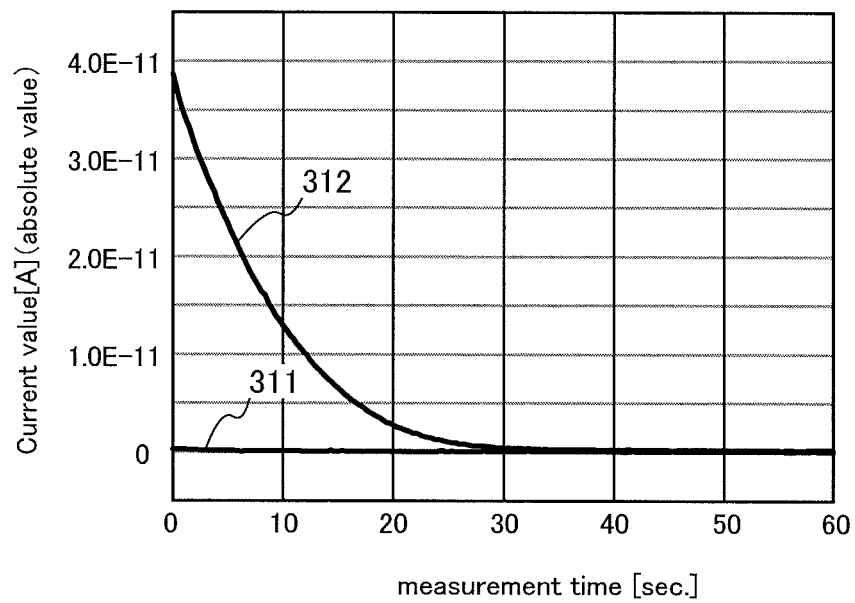

FIG. 2B shows the measurement results of the transient current. In FIG. 2B, the horizontal axis indicates voltage application time (measurement time), and the vertical axis indicates the absolute value of the current flowing between the electrode 301 and the electrode 304. A curve 311 in FIG. 2B represents a change in the value of the current flowing between the electrode 301 and the electrode 304 when a voltage of 2 V is applied to the electrode 304. A curve 312 represents a change in the value of the current flowing between the electrode 301 and the electrode 304 when a voltage of −2 V is applied to the electrode 304.

It is understood from the curves 311 and 312 that almost no current flows between the electrode 301 and the electrode 304 when a voltage of 2 V is applied to the electrode 304, and then, when a voltage of −2 V is applied to the electrode 304, a current which is apparently larger in amount than that in the case where a voltage of 2 V is applied to the electrode 304 flows between the electrode 301 and the electrode 304 for approximately 30 seconds after starting application of −2 V. Although not clear in FIG. 2B, it is confirmed that the current value represented by the curve 312 is larger than that represented by the curve 311 even after 30 seconds have passed.

The oxide semiconductor has a wide energy gap of 3.0 eV to 3.5 eV or more. Moreover, the intrinsic (i-type) or substantially intrinsic oxide semiconductor has a sufficiently low carrier density (e.g., lower than $1 \times 10^{12}/cm^3$, or lower than $1.45 \times 10^{10}/cm^3$) as compared to the carrier density of a general silicon wafer (approximately $1 \times 10^{14}/cm^3$). In other words, the i-type or substantially i-type oxide semiconductor is extremely close to an insulator as compared to a semiconductor containing silicon or the like.

A semiconductor containing silicon or germanium becomes n-type when a positive electric field is applied and becomes p-type when a negative electric field is applied. That is, such a semiconductor always serves as a conductor when an electric field is applied. On the other hand, an oxide semiconductor such as an In—Ga—Zn-based oxide semiconductor becomes n-type when a positive electric field is applied but remains i-type when a negative electric field is applied.

The measurement results of the transient current which are shown in FIG. 2B can be explained as follows.

When a voltage of 2 V is applied to the electrode 304, a positive electric field is applied to the oxide semiconductor 302 through the insulator 303, and the oxide semiconductor 302 becomes n-type. When the oxide semiconductor 302 becomes n-type, electric charge is supplied into the oxide semiconductor 302 from the electrode 301 and the oxide semiconductor 302 serves as a conductor; thus, only the insulator 303 serves as a dielectric layer in the capacitor 300. The insulator 303 is an insulator and thus almost no current flows between the electrode 301 and the electrode 304.

Then, when a voltage of −2 V is applied to the electrode 304, the oxide semiconductor 302 becomes i-type. As described above, an oxide semiconductor has a wide energy gap of 3.0 eV or more and an i-type or substantially i-type oxide semiconductor is extremely close to an insulator as compared to a semiconductor containing silicon or the like. Therefore, electric charge which is supplied into the oxide semiconductor 302 when the oxide semiconductor 302 is n-type (serves as a conductor) cannot easily move from the i-type oxide semiconductor 302 (serving as an insulator). The curve 312 in FIG. 2B shows that, at first, electric charge in the oxide semiconductor 302 which is near an interface between the oxide semiconductor 302 and the electrode 301 moves when the oxide semiconductor 302 becomes an insulator, and then electric charge in the oxide semiconductor 302 which is placed apart from the electrode 301 moves slowly because of effects of electric field drift.

An oxide semiconductor serves as either a conductor or an insulator depending on an electric field applied thereto and electric charge applied when the oxide semiconductor serves as a conductor can be retained even after the oxide semiconductor becomes an insulator (intrinsic). Further, by decreasing the overlap area of the electrode 301 and the oxide semiconductor 302, movement of electric charge from the oxide semiconductor 302 to the electrode 301 when the oxide semiconductor 302 becomes an insulator can be less likely to occur. That is, when the overlap area of the electrode 301 and the oxide semiconductor 302 is smaller than the overlap area of the electrode 304 and the oxide semiconductor 302, the insulated oxide semiconductor 302 can more reliably hold electric charge.

Using the above properties of the oxide semiconductor, it is possible to realize a storage element in which writing and reading of data can be performed at high speed with lower voltage than a conventional element.

Next, an example of a write operation (write mode) and a read operation (read mode) for storing two-value data (e.g., data of 0 or 1) in the semiconductor device disclosed in this embodiment will be specifically described with reference to timing charts of FIGS. 3A and 3B. The timing charts of FIGS. 3A and 3B show changes over time in potentials or states of the components illustrated in FIG. 1A. In this embodiment, an operation of storing a high-level potential $V_{DLH}$ or a low-level potential $V_{DLL}$ in the memory cell 200 as two-value data and an operation of reading the stored data will be described.

In FIGS. 3A and 3B, the first wiring 201 (the word line WL) is supplied with a high-level potential $V_{WLH}$ or a low-level potential $V_{WLL}$. The second wiring 202 (the data line DL) is supplied with the high-level potential $V_{DLH}$ or the low-level potential $V_{DLL}$. The third wiring 203 (the control line CL) is supplied with a high-level potential $V_{CLL}$ or a low-level potential $V_{CLL}$. The fourth wiring 204 (the bit line BL) is supplied with a high-level potential $V_{BLH}$ or a low-level potential $V_{BLL}$. The fifth wiring 205 (the read signal line RL) is supplied with a high-level potential $V_{RLH}$ or a low-level potential $V_{RLL}$.

In FIGS. 3A and 3B, a voltage (hereinafter referred to as $V_{thos}$) that makes the storage gate 212 (indicated by ML in FIGS. 3A and 3B) formed using an oxide semiconductor a conductor (n-type) is assumed to be 1 V, $V_{WLH}$ is set at 3 V, and $V_{WLL}$ is set at 0 V. Note that when a potential that makes the oxide semiconductor become n-type is 1 V, the potential $V_{WLH}$ that makes the storage gate 212 a conductor (n-type) may be 1 V or higher, and the potential $V_{WLL}$ that makes the storage gate 212 an insulator may be lower than 1 V. $V_{DLH}$ is 0 V, $V_{DLL}$ is −2 V, $V_{RLH}$ is 2 V, $V_{RLL}$ is 0 V, $V_{BLH}$ is 2 V, and $V_{BLL}$ is 0 V.

The potential of the storage gate 212 after the storage gate 212 becomes an insulator by $V_{DLH}$ written thereto is denoted by $V_{MLH}$. The potential of the storage gate 212 after the storage gate 212 becomes an insulator by $V_{DLL}$ written thereto is denoted by $V_{MLL}$. Note that in this embodiment, $V_{MLH}$ is −1V and $V_{MLL}$ is −3 V. The threshold voltage of the transistor 210 (indicated by TR in FIGS. 3A and 3B) is 1 V.

The insulated storage gate 212 is electrically floating (in a floating state). For that reason, when the potential of the first wiring 201 (the word line WL), the fifth wiring 205 (the read signal line RL), or the fourth wiring 204 (the bit line BL) is varied, the potential of the insulated storage gate 212 is varied accordingly.

The amount of the change in the potential of the insulated storage gate 212 is determined by the ratio of a capacitance (hereinafter "$C_{CM}$") generated between the first control gate 211 to which the first wiring 201 (the word line WL) is electrically connected and the storage gate 212 to a capacitance (hereinafter "$C_{MS}$") generated between the storage gate 212 and the channel formation region of the transistor 210.

When the value of $C_{CM}$ is larger than that of $C_{MS}$, the potential of the insulated storage gate 212 is changed almost dependently on change in the potential of the control gate 211, i.e., the potential of the first wiring 201 (the word line WL) and is hardly affected by the change in the potentials of the fifth wiring 205 (the read signal line RL) and the fourth wiring 204 (the bit line BL).

In other words, by making the value of $C_{CM}$ larger than that of $C_{MS}$, the influence of the change in the potentials of the fourth wiring 204 (the bit line BL) and the fifth wiring 205 (the read signal line RL) in the read operation is suppressed and data stored in the storage gate 212 can be accurately read.

The value of $C_{CM}$ is preferably more than or equal to 1.5 times as large as that of $C_{MS}$, further preferably more than or equal to 5 times or more than or equal to 10 times as large as that of $C_{MS}$. In this embodiment, the value of $C_{CM}$ is sufficiently larger than that of $C_{MS}$ and the influence of the change in the potentials of the fourth wiring 204 (the bit line BL) and the fifth wiring 205 (the read signal line RL) is negligible.

First, a write (rewrite) operation of data into the memory cell 200 will be described. Here, an operation for holding the high-level potential $V_{MLH}$ in the storage gate 212 in the case of using an n-channel transistor as the transistor 210 is described. First, as a first operation, the high-level potential $V_{WLH}$, the high-level potential $V_{CLH}$, and the high-level potential $V_{DLH}$ are respectively applied to the first wiring 201 (the word line WL), the third wiring 203 (the control line CL), and the second wiring 202 (the data line DL) which are connected to the memory cell 200 that is selected to be subjected to data writing.

When the high-level potential $V_{WLH}$ is applied to the first wiring 201 (the word line WL), the potential of the first control gate 211 becomes the high-level potential $V_{WLH}$. When the high-level potential $V_{CLH}$ is applied to the third wiring 203 (the control line CL), the potential of the second control gate 213 becomes the high-level potential $V_{CLH}$.

Accordingly, the potential difference between the second wiring 202 (the data line DL) and the first control gate 211, with the second wiring 202 (the data line DL) as a reference, becomes 3 V; the potential difference between the second wiring 202 (the data line DL) and the second control gate 213, with the second wiring 202 (the data line DL) as a reference, becomes 2 V. In other words, both the potential differences are more than $V_{thos}$ (1 V); thus, the entire storage gate 212 becomes a conductor, the potential of the second wiring 202 (the data line DL) is supplied to the storage gate 212, and the potential of the storage gate 212 becomes the high-level potential $V_{DLH}$.

There is no particular limitation on the potentials of the fourth wiring 204 (the bit line BL) and the fifth wiring 205 (the read signal line RL) in the write operation; here, both the potentials are 0 V.

Then, as a second operation, the low-level potential $V_{WLL}$ is applied to the first wiring 201 (the word line WL) and the low-level potential $V_{CLL}$ is applied to the third wiring 203 (the control line CL). At this time, the potential of the second wiring 202 (the data line DL) is set to remain at the high-level potential $V_{DLH}$. When the low-level potentials are applied to the first wiring 201 (the word line WL) and the third wiring 203 (the control line CL), the potentials of the first control gate 211 and the second control gate 213 become the low-level potential. Accordingly, the potential difference between the second wiring 202 (the data line DL) and the first control gate 211, with the second wiring 202 (the data line DL) as a reference, and the potential difference between the second wiring 202 (the data line DL) and the second control gate 213, with the second wiring 202 (the data line DL) as a reference, become less than $V_{thos}$ (1 V) and the storage gate 212 becomes an insulator.

Since a voltage that makes the storage gate 212 become n-type is 1 V at this time, the potential of the storage gate 212 is the high-level potential $V_{DLH}$ as long as the potential difference between the second wiring 202 (the data line DL) and the first wiring 201 (the control gate 211) is 1 V or more; when the potential difference is less than 1 V, the storage gate 212 becomes an insulator. As a result of the change in the potential of the first wiring 201 (the word line WL), the potential of the insulated storage gate 212 becomes $V_{DLH}$−1 V−$V_{WLL}$. That is, the potential of the insulated storage gate 212 becomes −1 V (the high-level potential $V_{MLH}$) in this embodiment.

When the storage gate 212 becomes an insulator, electric charge in the storage gate 212 cannot move; therefore, the potential of the storage gate 212 remains at the high-level potential $V_{MLH}$ even when the potential of the second wiring 202 is changed. Thus, the data can be stored in the storage gate 212.

The operation for holding the low-level potential $V_{MLL}$ in the storage gate 212 can be understood with $V_{DLH}$ replaced with $V_{DLL}$ in FIG. 3A under the above-described operation principle.

Both the high-level potential $V_{MLH}$ and the low-level potential $V_{MLL}$ which are stored in the storage gate 212 are a potential at which the transistor 210 is off. When the potential which is stored in the storage gate 212 is a potential at which the transistor 210 is off, unintended reading of data from another memory cell in the case where a plurality of memory cells 200 are connected is prevented and data can be accurately read, resulting in improvement in the reliability of the semiconductor device.

Next, an operation of reading data stored in the memory cell 200 will be described. FIG. 3B is a timing chart of the operation in the read mode. Here, an operation in the case where the high-level potential $V_{MLH}$ is held in the storage gate 212 is described.

First, as a first operation, the fourth wiring 204 (the bit line BL) is supplied with (precharged with) electric charge, so that the potential of the fourth wiring 204 (the bit line BL) is set at the high-level potential $V_{BLH}$. Note that the high-level potential $V_{BLH}$ and the low-level potential $V_{RLL}$ are different from each other. At this time, each of the potentials of the first wiring 201 (the word line WL) and the third wiring 203 (the control line CL) is set to remain at the low-level potential. There is no particular limitation on the potential of the second wiring 202 (the data line DL); here, the second wiring 202 has the high-level potential $V_{DLH}$.

Then, as a second operation, the potential of the third wiring 203 (the control line CL) is set to remain at the low-level potential $V_{CLL}$ and the potential of the first wiring 201 (the word line WL) is set at the high-level potential $V_{WLH}$. Since the high-level potential $V_{MLH}$ held in the storage gate 212 is −1 V and the low-level potential $V_{RLL}$ is 0 V at this time, the gate-source voltage is as follows: $V_{WLH}+V_{MLH}-V_{RLL}=3$ V+(−1 V)−0 V=2 V. That is, the gate-source voltage is higher than or equal to the threshold voltage (which is 1 V in this embodiment) of the transistor 210; thus, the transistor 210 is turned on. When the transistor 210 is turned on, the potential of the fifth wiring 205 (the read signal line RL) is supplied to the fourth wiring 204 (the bit line BL) through the transistor 210, so that the potential of the fourth wiring 204 (the bit line BL) is changed.

In the case where the low-level potential $V_{MLL}$ is stored in the storage gate 212, the gate-source voltage ($V_{WLH}+V_{MLL}-V_{RLL}=3$ V+(−3 V)−0 V=0 V) cannot exceed the threshold voltage of the transistor 210 even when the potential of the first wiring 201 (the word line WL) is set at the high-level potential $V_{WLH}$. In that case, the transistor 210 remains off, and the potential of the fourth wiring 204 is not changed. In such a manner, data stored in the storage gate 212 can be read by detecting a change in the potential of the fourth wiring 204 (the bit line BL) when the potential of the fifth wiring 205 (the read signal line RL) is the low-level potential $V_{RLL}$.

In a read operation, by setting the potential of the third wiring 203 (the control line CL) at the low-level potential $V_{CLL}$, a region of the storage gate 212, which overlaps with the second control gate 213, remains to be an insulator. Thus, by setting the potential of the third wiring 203 (the control line CL) at the low-level potential $V_{CLL}$, the potential of the first wiring 201 (the word line WL) becomes the high-level potential $V_{WLH}$ and the potential of the second wiring 202 (the data line DL) does not affect the storage gate 212 even when a region of the storage gate 212, which overlaps with the first control gate, becomes a conductor. In other words, by setting the potential of the third wiring 203 (the control line CL) at the low-level potential $V_{CLL}$, the storage gate 212 can retain the stored data even when the potentials of the second wiring 202 (the data line DL) and the first wiring 201 (the word line WL) are changed.

As described above, data (electric charge) held in the storage gate 212 is retained until the data is rewritten with new data in a write mode. The insulated oxide semiconductor has high resistivity and electric charge hardly moves therein; thus, the potential of the storage gate 212 can be retained for an extremely long time.

Note that in a so-called flash memory, it is necessary to keep a proper distance between cells in order to prevent the potential of a control gate from adversely affecting a floating gate of an adjacent cell. This is one of factors inhibiting higher integration of the semiconductor device. The factor is attributed to the following principle of a flash memory: tunneling current is generated by application of a high electric field.

Further, because of the above principle of a flash memory, deterioration of an insulating film proceeds, which causes a limitation on the write cycles (approximately 10000 cycles).

The semiconductor device according to the invention disclosed herein does not use the above principle of charge injection by tunneling current. That is, unlike a flash memory, a high electric field for charge injection is not necessary. Consequently, it is not necessary to consider an influence of a high electric field from a control gate on an adjacent cell, which facilitates high integration.

Further, since electric charge is not injected by tunneling current, deterioration of a memory cell due to tunneling current is not caused. In other words, the semiconductor device according to the disclosed invention has higher durability and reliability than a flash memory.

In addition, the semiconductor device according to the disclosed invention has advantages over a flash memory in that a high electric field is not necessary and a large peripheral circuit (such as a booster circuit) is not necessary.

Note that an n-channel transistor in which electrons are majority carriers is used in the above description; a p-channel transistor in which holes are majority carriers can be used instead of the n-channel transistor. In the case of using p-channel transistors, potentials supplied to the wirings are set under the above-described operation principle.

Figure 1B:
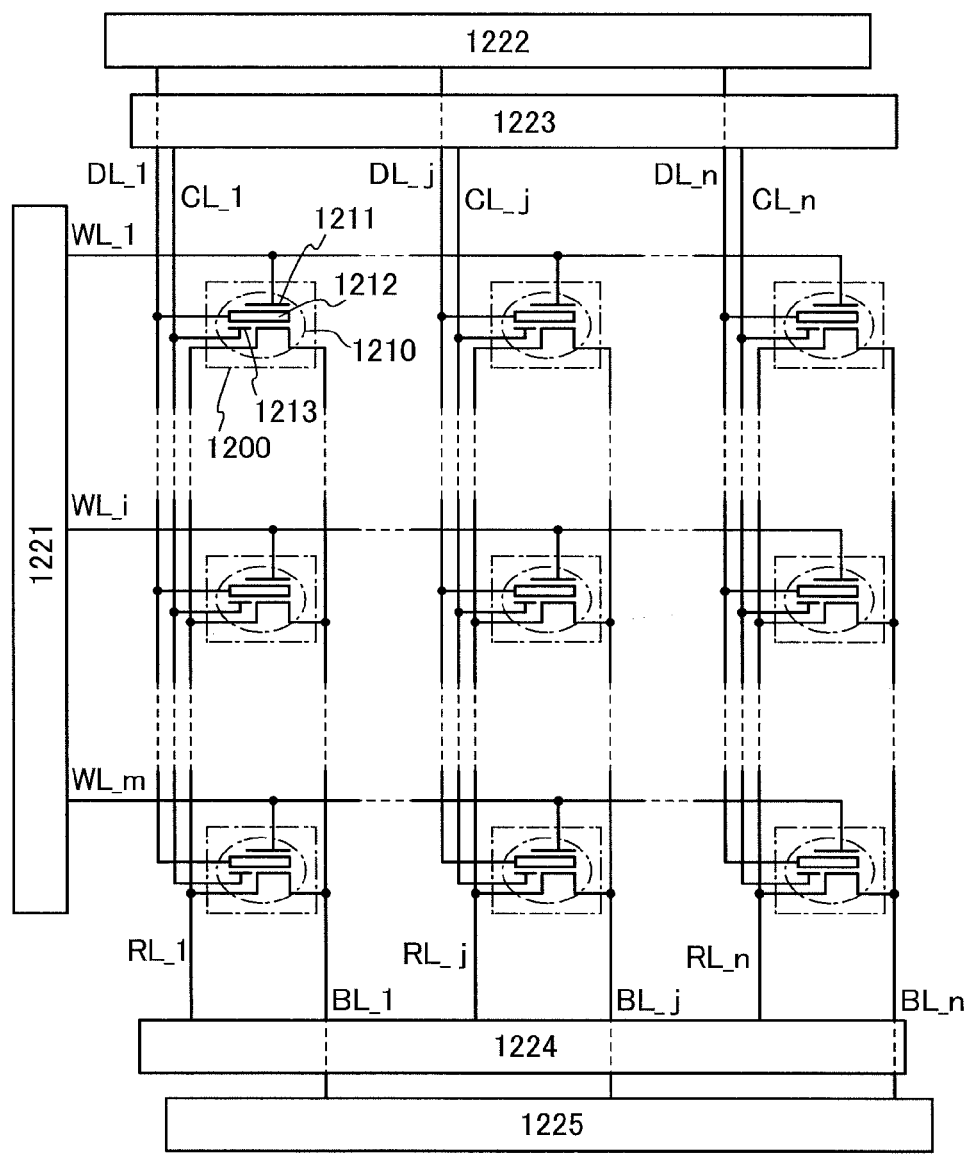

FIG. 1B illustrates an example of a circuit diagram of a semiconductor device with a memory capacity of m×n bits, including the semiconductor devices (the memory cells) illustrated in FIG. 1A. FIG. 1B is a circuit diagram of a NOR semiconductor device in which memory cells 1200 are connected in parallel.

The semiconductor device illustrated in FIG. 1B includes a memory cell array and peripheral circuits such as a first driver circuit 1221, a second driver circuit 1222, a third driver circuit 1223, a fourth driver circuit 1224, and a fifth driver circuit 1225. The memory cell array includes m word lines WL, n data lines DL, n control lines CL, n read signal lines RL, n bit lines BL, and a plurality of memory cells 1200 that are arranged in a matrix of m rows (in the vertical direction) and n columns (in the horizontal direction) (m and n are natural numbers). Here, the structure illustrated in FIG. 1A is applied to the memory cell 1200.

Each of the memory cells 1200 includes a transistor 1210. The transistor 1210 has a first control gate 1211, a second control gate 1213, and a storage gate 1212. The first control gate 1211 is electrically connected to the word line WL. The second control gate 1213 is electrically connected to a control line CL. The storage gate 1212 is electrically connected to the data line DL. One of a source and a drain of the transistor 1210 is electrically connected to the read signal line RL. The other of the source and the drain of the transistor 1210 is electrically connected to the bit line BL.

A memory cell 1200 (i,j) of an i-th row and a j-th column (i is an integer which is greater than or equal to 1 and less than or equal to m and j is an integer which is greater than or equal to 1 and less than or equal to n) is electrically connected to a data line DL_j, a control line CL_j, a read signal line RL_j, a bit line BL_j, and a word line WL_i.

The word lines WL are electrically connected to the first driver circuit 1221. The data lines DL are electrically connected to the second driver circuit 1222. The control lines CL are electrically connected to the third driver circuit 1223. The read signal lines RL are electrically connected to the fourth driver circuit 1224. The bit lines BL are electrically connected to the fifth driver circuit 1225. Note that the first driver circuit 1221, the second driver circuit 1222, the third driver circuit 1223, the fourth driver circuit 1224, and the fifth driver circuit 1225 are separately provided here; alternatively, a decoder having one or a plurality of their functions may be used.

Although data can be written into the memory cell 1200 with the above-described write operation, when $V_{WLH}$ is applied to a word line WL, the storage gates of the all the transistors 1210 connected to the word line WL become conductors. In view of this problem, in the write operation, the potential of the control line CL connected to the memory cell 1200 subjected to data writing is set at the high-level potential $V_{CLH}$ and the potential of the control line CL connected to the memory cell 1200 not subjected to data writing is set at the low-level potential $V_{CLL}$, whereby data which is stored in the memory cell 1200 not subjected to data writing is prevented from being rewritten unintentionally.

By setting the potential of the word line WL which is connected to the memory cell 1200 not subjected to data writing at the low-level potential $V_{WLL}$, the data in the memory cell 1200 not subjected to data writing can be prevented from being rewritten even when the potential of the control line CL connected to the memory cell 1200 not subjected to data writing becomes the high-level potential $V_{CLH}$.

Data can be written into only one memory cell which is connected to the selected word line WL; data can also be written into a plurality of or all of the memory cells at the same time as long as the memory cells are connected to the selected word line WL.

Data can be read from the memory cell 1200 with the above-described read operation. In the read operation, the potentials of all the control lines CL are set at the low-level potential $V_{CLL}$, which prevents unintended rewriting of data in the memory cell which is not subjected to data reading and is connected to the word line WL selected for data reading. Further, in order to prevent data in a memory cell not subjected to data reading from being unintentionally read, the potential of the word line WL other than the word line WL selected for data reading is set at the low-level potential $V_{WLL}$.

Note that data reading can be performed in only one memory cell or a plurality of or all of the memory cells at the same time as long as the memory cells are connected to the selected word line WL.

Note that an n-channel transistor (n-type transistor) is used in the above description; a p-channel transistor can be used instead of the n-channel transistor. In the case of using p-channel transistors, potentials supplied to the wirings are set under the above-described operation principle.

The semiconductor device disclosed in this embodiment does not include a capacitor that is needed for a DRAM in terms of the operation principle; therefore, the area per unit memory cell can be reduced and integration of the memory cells can be increased. For example, given that the minimum feature size is F, the area of a memory cell can be $15F^2$ to $25F^2$. Therefore, improvement in yield of the semiconductor device and a reduction in cost can be achieved.

In addition, in the semiconductor device disclosed in this embodiment, stored electric charge hardly moves because data is stored by making an oxide semiconductor an insulator. Thus, a refresh operation needed for a conventional DRAM can be unnecessary or performed much less often (e.g., about once a month or a year), so that power consumption of the semiconductor device can be sufficiently reduced.

Further, in the semiconductor device disclosed in this embodiment, data can be directly rewritten by rewriting of new data into a memory cell. For that reason, an erase operation which is necessary for a flash memory or the like is not needed, so that a reduction in operation speed due to the erase operation can be prevented. That is, high-speed operation of the semiconductor device can be realized. Moreover, a high voltage necessary for a conventional floating gate transistor to write and erase data is unnecessary; thus, power consumption of the semiconductor device can be further reduced.

Figure 4:
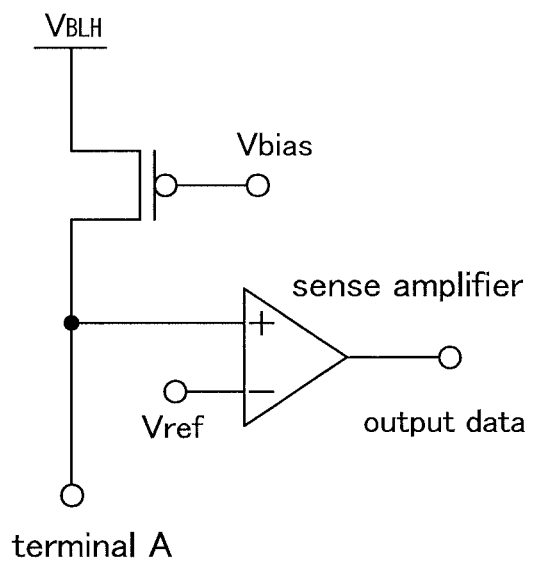
FIG. 4 is a circuit diagram of a semiconductor device.

FIG. 4 schematically illustrates a reading circuit for reading data stored in a memory cell. The reading circuit includes a transistor and a sense amplifier circuit.

At the time of reading data, a terminal A is connected to a bit line BL to which a memory cell subjected to data reading is connected. Furthermore, a bias potential Vbias is applied to a gate electrode of the transistor so that the potential of the terminal A is controlled.

The sense amplifier circuit outputs high data when the potential of the terminal A is higher than a reference potential Vref (e.g., 0 V) and outputs low data when the potential of the terminal A is lower than the reference potential Vref. Specifically, first, the transistor is turned on, and the bit line BL connected to the terminal A is precharged to have the potential $V_{BLH}$. Next, the memory cell subjected to data reading is set to a read mode, and the potential of the bit line BL connected to the terminal A is compared with the reference potential Vref. Accordingly, high data or low data is output as output data in accordance with the data stored in the memory cell.

By using the reading circuit in the above manner, data stored in the memory cell can be read. Note that the reading circuit of this embodiment is an example; another known circuit may be used.

The structures described in this embodiment can be combined as appropriate with any of the structures described in the other embodiments.

Embodiment 2

In this embodiment, an example of a structure and a manufacturing method of the semiconductor device described in Embodiment 1 will be described with reference to FIGS. 5A to 5C, FIGS. 6A to 6D, and FIGS. 7A and 7B.

<Cross-Sectional Structure and Planar Structure of Semiconductor Device>

Figure 5A:
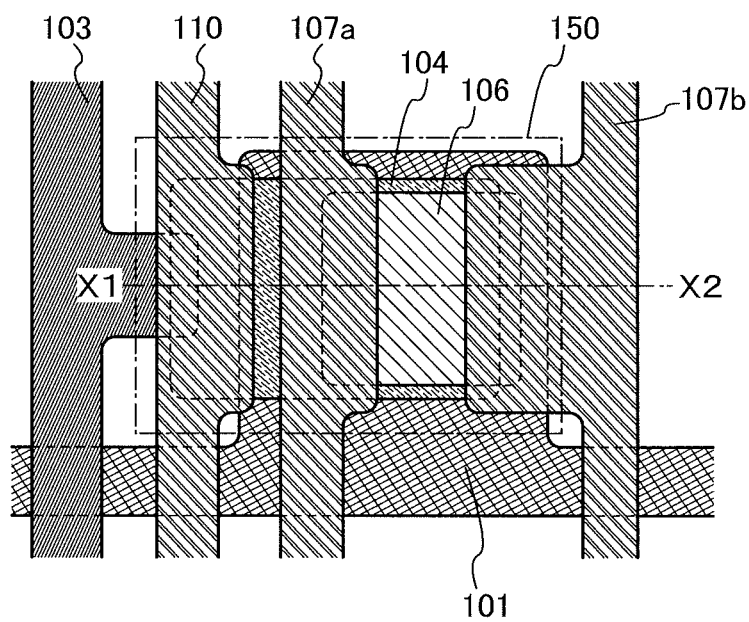
FIG. 5A is a plan view and FIGS. 5B and 5C are cross-sectional views of a semiconductor device.
Figure 5B:
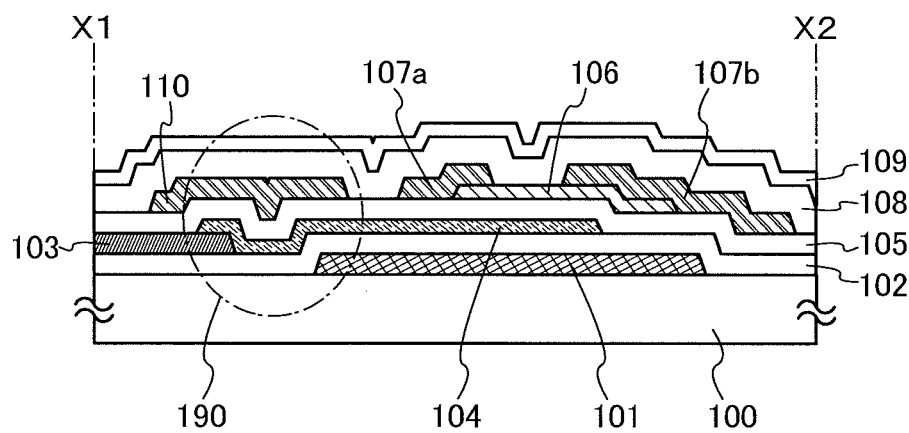
Figure 5C:
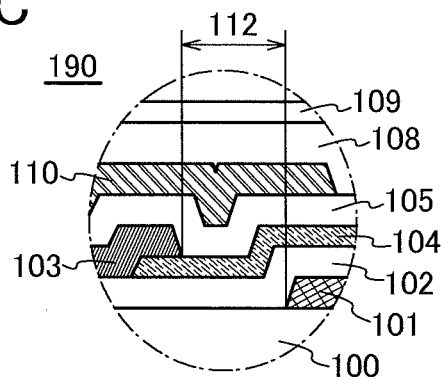

FIGS. 5A to 5C illustrate an example of a transistor that can be used as a storage element. FIG. 5A illustrates a planar structure of a transistor 150. FIG. 5B illustrates a cross section along X1-X2 in FIG. 5A. FIG. 5C is an enlarged view of a portion 190 in FIG. 5B.

In the transistor 150, a first control gate 101 is provided over a substrate 100. A first gate insulating layer 102 is provided over the first control gate 101. An electrode 103 is provided over the first gate insulating layer 102. A storage gate 104 is provided in contact with the first gate insulating layer 102 and the electrode 103. A second gate insulating layer 105 is provided over the storage gate 104. A second control gate 110 and a semiconductor layer 106 are provided over the second gate insulating layer 105. A source electrode 107a and a drain electrode 107b are provided over the semiconductor layer 106. An insulating layer 108 is provided over the semiconductor layer 106, the source electrode 107a, and the drain electrode 107b. A protective insulating layer 109 is provided over the insulating layer 108. The transistor 150 has a bottom-gate structure and an inverted staggered structure.

Although not shown, the first control gate 101 is electrically connected to the word line WL, the source electrode 107a is electrically connected to the read signal line RL, the drain electrode 107b is electrically connected to the bit line BL, the electrode 103 is electrically connected to the data line DL, and the second control gate 110 is electrically connected to the control line CL. Further, the first control gate 101 corresponds to the first control gate 211 and the second control gate 110 corresponds to the second control gate 213.

The electrode 103 is provided in contact with part of the storage gate 104 and supplies data to be stored to the storage gate 104. The storage gate 104 is sandwiched between the first gate insulating layer 102 and the second gate insulating layer 105. Moreover, the storage gate 104 is in contact with the first gate insulating layer 102 and the second gate insulating layer 105 at least in a region overlapping with a channel formation region of the semiconductor layer 106 (i.e., a region in the semiconductor layer 106, placed between the source electrode 107a and the drain electrode 107b).

The first control gate 101 is placed to overlap with the storage gate 104 and the channel formation region of the semiconductor layer 106. The storage gate 104 is placed between the first control gate 101 and the semiconductor layer 106. The electrode 103 is placed apart from the first control gate 101 and the channel formation region of the semiconductor layer 106.

In FIG. 5C, a region from an edge of the first control gate 101 to an edge of the electrode 103 is shown enlarged. The storage gate 104 extends beyond the edge of the first control gate 101 and has a region (an offset region 112) which is in contact with the electrode 103. The second control gate 110 is placed to overlap with the edge of the first control gate 101, the offset region 112 of the storage gate 104, and the edge of the electrode 103.

In the case where data is written into the storage gate 104 with the above structure, accurate data writing can be performed in such a manner that a high-level potential is supplied to the first control gate 101 and the second control gate 110, and at least a portion of the storage gate 104 from the portion overlapping with the channel formation region of the semiconductor layer 106 to the portion in contact with the electrode 103 is made to be a conductor.

Further, when data is read by supply of a high-level potential to the first control gate 101, the potential of the second control gate 110 is set at the potential that makes the offset region 112 of the storage gate 104 an insulator, whereby the potential of the electrode 103 can be prevented from being supplied to the storage gate 104.

<Method for Manufacturing Semiconductor Device>

Next, an example of a method for manufacturing the transistor 150 will be described with reference to FIGS. 6A to 6D. Note that unless otherwise specified, a photolithography process in this specification includes a step of forming a resist mask, a step of etching a conductive layer or an insulating layer, and a step of separating the resist mask.

First, a conductive layer is formed over the substrate 100. Then, through a first photolithography process, the conductive layer (as well as a wiring formed from the conductive layer) is partly removed by etching, and the first control gate 101 is formed. Note that a resist mask may be formed by an inkjet method, in which case manufacturing costs can be reduced because a photomask is not used.

There is no particular limitation on a substrate that can be used as the substrate 100, and a glass substrate, a ceramic substrate, a quartz substrate, a sapphire substrate, a crystallized glass substrate, or the like can be used.

Alternatively, a flexible substrate may be used as the substrate 100. In the case of using a flexible substrate, a transistor may be directly formed over a flexible substrate; alternatively, a transistor may be formed over another substrate and then separated from the substrate and transferred to a flexible substrate. Note that in order to separate the transistor from the substrate and transfer it to the flexible substrate, a separation layer is preferably provided between the substrate and the transistor.

A base layer may be provided between the substrate 100 and the first control gate 101. The base layer can be formed with a single-layer structure or a stacked structure using at least one of the following insulating layers: an aluminum nitride layer, an aluminum oxide layer, an aluminum oxynitride layer, an aluminum nitride oxide layer, a silicon nitride layer, a silicon oxide layer, a silicon nitride oxide layer, and a silicon oxynitride layer. The base layer has a function of preventing diffusion of an impurity element from the substrate 100.

When a halogen element such as chlorine or fluorine is contained in the base layer, a function of preventing diffusion of an impurity element from the substrate 100 can be further improved. The peak of the concentration of a halogen element contained in the base layer is preferably higher than or equal to $1 \times 10^{15}/\text{cm}^3$ and lower than or equal to $1 \times 10^{20}/\text{cm}^3$ measured by secondary ion mass spectrometry (SIMS).

The base layer may be formed using gallium oxide. Alternatively, the base layer may have a stacked structure of a gallium oxide layer and any of the above insulating layers. Gallium oxide is a material that is hardly charged, and thus can suppress variation in threshold voltage due to charge build-up of the insulating layer.

The control gate 101 can be formed with a single-layer structure or a stacked structure using a metal material such as molybdenum (Mo), titanium (Ti), tantalum (Ta), tungsten (W), aluminum (Al), copper (Cu), chromium (Cr), neodymium (Nd), scandium (Sc), or magnesium (Mg) or an alloy material containing any of these materials as a main component.

Figure 6A:
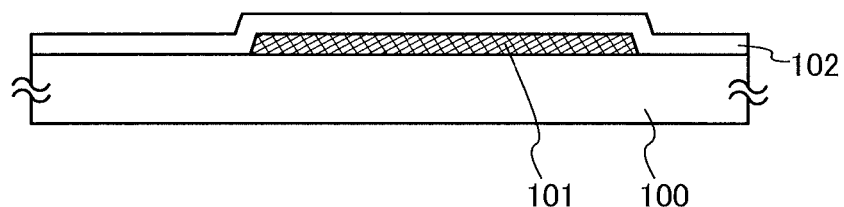
FIGS. 6A to 6D are cross-sectional views illustrating steps for manufacturing a semiconductor device.

Then, the first gate insulating layer 102 is formed over the first control gate 101 (see FIG. 6A). The first gate insulating layer 102 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, lanthanum oxide, cesium oxide, magnesium oxide, yttrium oxide, hafnium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like by plasma CVD, sputtering, or the like. The first gate insulating layer 102 is not limited to a single layer and may be a stack of different layers. For example, the first gate insulating layer 102 may be formed in the following manner: a silicon nitride layer ($SiN_y$ (y>0)) is formed by plasma CVD as a gate insulating layer A and a silicon oxide layer ($SiO_x$ (x>0)) is stacked over the gate insulating layer A as a gate insulating layer B.

Other than sputtering and plasma CVD, the first gate insulating layer 102 can be formed by, for example, high-density plasma CVD using microwaves (e.g., a frequency of 2.45 GHz).

In particular, the first gate insulating layer 102 is preferably formed using an insulating material containing the same kind of component as the oxide semiconductor that is formed later. Such a material is compatible with the oxide semiconductor, and the use of such a material for the first gate insulating layer 102 can keep the interface state between the oxide semiconductor and the first gate insulating layer 102 favorable. Here, "the same kind of component as the oxide semiconductor" means one or more of elements selected from constituent elements of the oxide semiconductor. For example, in the case where the oxide semiconductor is formed using an In—Ga—Zn-based oxide semiconductor material, gallium oxide is given as an insulating material containing the same kind of component as the oxide semiconductor.

In the case of employing a stacked structure, the first gate insulating layer 102 may have a stacked structure of a film formed using an insulating material containing the same kind of component as the oxide semiconductor and a film formed using a material different from that of the film.

Next, a conductive layer is formed over the first gate insulating layer 102. Then, through a second photolithography process, the conductive layer is partly removed by etching, and the electrode 103 (as well as a wiring formed from the same layer as the electrode 103) is formed. Note that a resist mask may be formed by an inkjet method, in which case manufacturing costs can be reduced because a photomask is not used.

For the conductive layer used for the electrode 103, a metal containing an element selected from Al, Cr, Cu, Ta, Ti, Mo, and W, a metal nitride containing any of the above elements as a component (e.g., titanium nitride, molybdenum nitride, or tungsten nitride), or the like can be used, for example. The electrode 103 may have a structure in which a refractory metal layer of Ti, Mo, W, or the like or a metal nitride layer of any of these elements (e.g., a titanium nitride layer, a molybdenum nitride layer, or a tungsten nitride layer) is stacked on one or both of a bottom surface and a top surface of a metal layer of Al, Cu, or the like.

Next, an oxide semiconductor layer with a thickness of greater than or equal to 2 nm and less than or equal to 200 nm, preferably greater than or equal to 5 nm and less than or equal to 30 nm is formed over the electrode 103 and the first gate insulating layer 102.

In order that hydrogen, a hydroxyl group, and moisture may be contained in the oxide semiconductor layer as little as possible, it is preferable that the substrate 100 where the electrode 103 and the first gate insulating layer 102 are formed be subjected to preheating in a preheating chamber of a sputtering apparatus as pretreatment for forming the oxide semiconductor layer so that impurities such as hydrogen and moisture adsorbed on the substrate 100 are removed and exhausted. As an exhaustion unit provided in the preheating chamber, a cryopump is preferably employed. Note that this preheating treatment can be omitted. Further, before the insulating layer 108 is formed, this preheating may be similarly performed on the substrate 100 over which components up to and including the source electrode 107a and the drain electrode 107b are formed.

As an oxide semiconductor used for the oxide semiconductor layer, any of the following oxide semiconductors can be used, for example: a four-component metal oxide, such as an In—Sn—Ga—Zn-based oxide semiconductor; a three-component metal oxide, such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, a Sn—Al—Zn-based oxide semiconductor, an In—Hf—Zn-based oxide semiconductor, an In—La—Zn-based oxide semiconductor, an In—Ce—Zn-based oxide semiconductor, an In—Pr—Zn-based oxide semiconductor, an In—Nd—Zn-based oxide semiconductor, an In—Pm—Zn-based oxide semiconductor, an In—Sm—Zn-based oxide semiconductor, an In—Eu—Zn-based oxide semiconductor, an In—Gd—Zn-based oxide semiconductor, an In—Tb—Zn-based oxide semiconductor, an In—Dy—Zn-based oxide semiconductor, an In—Ho—Zn-based oxide semiconductor, an In—Er—Zn-based oxide semiconductor, an In—™—Zn-based oxide semiconductor, an In—Yb—Zn-based oxide semiconductor, and an In—Lu—Zn-based oxide semiconductor; a two-component metal oxide, such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, and an In—Ga-based oxide semiconductor; an In—based oxide semiconductor; a Sn-based oxide semiconductor; and a Zn-based oxide semiconductor. Further, $SiO_2$ may be contained in the above oxide semiconductor. Note that the oxide semiconductor may be amorphous or crystallized partly or entirely.

When a crystalline oxide semiconductor is used as the oxide semiconductor, the oxide semiconductor is preferably formed over a level (flat) surface. Specifically, the oxide semiconductor is preferably formed over a surface whose average surface roughness (Ra) is 1 nm or less, more preferably 0.3 nm or less. Ra can be measured using an atomic force microscope (AFM).

The oxide semiconductor preferably contains In, more preferably In and Zn. In addition, Ga, Sn, Hf, Al, or a lanthanoid may be contained in the above oxide semiconductor.

Here, for example, an In—Ga—Zn-based oxide semiconductor refers to an oxide semiconductor containing indium (In), gallium (Ga), and zinc (Zn), and there is no particular limitation on the composition ratio thereof. The In—Ga—Zn—O-based oxide semiconductor may contain an element other than In, Ga, and Zn.

For the oxide semiconductor layer, a thin film expressed by a chemical formula of $InMO_3(ZnO)_m$ (m>0) can be used. Here, M represents one or more of metal elements selected from Sn, Zn, Ga, Al, Mn, and Co. For example, M can be Ga, Ga and Al, Ga and Mn, or Ga and Co.

In this embodiment, the oxide semiconductor layer is formed by sputtering using an In—Ga—Zn-based metal oxide target. The oxide semiconductor layer can be formed by sputtering in a rare gas (typically argon) atmosphere, an oxygen atmosphere, or a mixed atmosphere of a rare gas and oxygen.

As a target for forming the oxide semiconductor layer by sputtering, for example, a metal oxide target having a composition ratio of $In_2O_3:Ga_2O_3:ZnO=1:1:1$ [molar ratio] is used to form an In—Ga—Zn-based oxide semiconductor. Without limitation to the material and the composition of the target, a metal oxide target having a composition ratio of $In_2O_3:Ga_2O_3:ZnO=1:1:2$ [molar ratio] may be used, for example. An In—Ga—Zn-based oxide semiconductor can be referred to as IGZO.

An In—Sn—Zn-based oxide semiconductor can be referred to as ITZO. In the case where a thin film of ITZO is formed as an oxide semiconductor layer, a target for formation of a film of ITZO by sputtering may have a composition ratio of In:Sn:Zn=1:2:2, In:Sn:Zn=2:1:3, In:Sn:Zn=1:1:1, or In:Sn:Zn=20:45:35 in an atomic ratio, for example.

The relative density of the metal oxide target is greater than or equal to 90% and less than or equal to 100%, preferably greater than or equal to 95% and less than or equal to 99.9%. With the use of a metal oxide target with a high relative density, a dense oxide semiconductor layer can be deposited.

It is preferable that a high-purity gas from which impurities such as hydrogen, water, a compound containing a hydroxyl group, and a hydride are removed be used as a sputtering gas for forming the oxide semiconductor layer. For example, when argon is used as a sputtering gas, it is preferable that the purity be 9N, the dew point be −121° C., the content of $H_2O$ be 0.1 ppb or lower, and the content of $H_2$ be 0.5 ppb or lower. When oxygen is used as a sputtering gas, it is preferable that the purity be 8N, the dew point be −112° C., the content of $H_2O$ be 1 ppb or lower, and the content of $H_2$ be 1 ppb or lower.

When the oxide semiconductor layer is formed, the substrate is held in a deposition chamber kept under a reduced pressure and the substrate temperature is set at higher than or equal to 100° C. and lower than or equal to 600° C., preferably higher than or equal to 300° C. and lower than or equal to 500° C. By heating the substrate during deposition, the concentration of impurities such as hydrogen, moisture, a hydride, or a hydroxyl group in the oxide semiconductor layer can be reduced. In addition, damage by sputtering is reduced. Then, a sputtering gas from which hydrogen and moisture are removed is introduced into the deposition chamber while moisture remaining therein is removed, and the oxide semiconductor layer is formed with the use of the above target.

In order to remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber evacuated with a cryopump, a hydrogen atom, a compound containing a hydrogen atom, such as water ($H_2O$) (preferably, also a compound containing a carbon atom), and the like are evacuated, so that the concentration of impurities in the oxide semiconductor layer formed in the deposition chamber can be reduced.

Further, it is preferable that the concentration of an alkali metal such as Na or Li in the oxide semiconductor layer be $1\times10^{18}$ atoms/cm$^3$ or lower, further preferably $2\times10^{16}$ atoms/cm$^3$ or lower.

An example of the deposition conditions is as follows: the distance between the substrate and the target is 100 mm, the pressure is 0.6 Pa, the power of the DC power source is 0.5 kW, and oxygen (the flow rate of oxygen is 100%) is used as a sputtering gas. Note that it is preferable to use a pulsed direct-current power source because powder substances (also referred to as particles or dust) generated during deposition can be reduced and the film thickness can be uniform.

Next, first heat treatment is performed. With the first heat treatment, excessive hydrogen (including water and a hydroxyl group) in the oxide semiconductor layer is removed (dehydration or dehydrogenation) and the oxide semiconductor layer can be purified.

The first heat treatment is performed at a temperature of higher than or equal to 250° C. and lower than or equal to 750° C. or at a temperature of higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra-dry air (with a moisture content of 20 ppm (equivalent to a dew point of −55° C.) or lower, preferably 1 ppm or lower, further preferably 10 ppb or lower when measured with a dew-point meter using cavity ring-down laser spectroscopy (CRDS)). For example, the substrate is put in an electric furnace that is one of heat treatment apparatuses, and the oxide semiconductor layer is subjected to heat treatment at 450° C. for one hour in a nitrogen atmosphere.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the first heat treatment, GRTA may be performed in the following manner: the substrate is moved into an inert gas heated to a temperature as high as 650° C. to 700° C., heated for several minutes, and moved out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, and the like. It is also preferable that the purity of nitrogen, oxygen, or the rare gas which is introduced into a heat treatment apparatus be set to 6N (99.9999%) or higher, preferably 7N (99.99999%) or higher (i.e., the impurity concentration is 1 ppm or lower, preferably 0.1 ppm or lower).

Figure 6B:
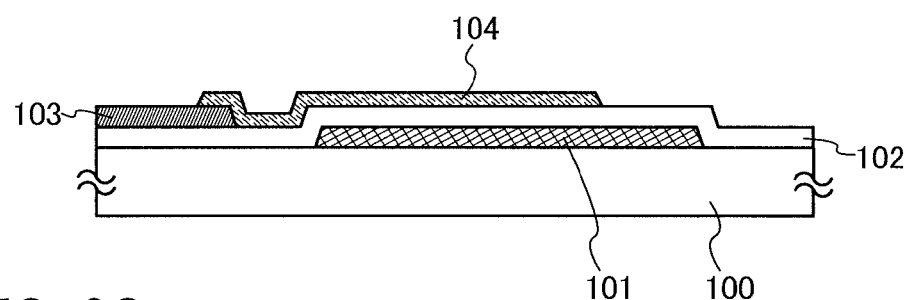

Next, through a third photolithography process, the oxide semiconductor layer is partly removed by etching, and the storage gate 104 is formed (see FIG. 6B). Note that a resist mask for forming the storage gate 104 may be formed by an inkjet method, in which case manufacturing costs can be reduced because a photomask is not used.

In the case where a contact hole is formed in the first gate insulating layer 102, the contact hole can be formed at the same time as processing of the oxide semiconductor layer.

Note that the etching of the oxide semiconductor layer may be dry etching, wet etching, or both dry etching and wet etching. As an etchant used for wet etching of the oxide semiconductor layer, a mixed solution of phosphoric acid, acetic acid, and nitric acid can be used, for example. Alternatively, ITO-07N (produced by Kanto Chemical Co., Inc.) may be used.

After the resist mask is removed, oxygen may be introduced into the storage gate 104 by an ion implantation method. Oxygen can be alternatively introduced by a plasma doping method. Specifically, oxygen is turned into plasma with the use of radio-frequency (RF) power, and oxygen radicals and/or oxygen ions are introduced into the oxide semiconductor layer over the substrate. At this time, it is preferable to apply a bias to the substrate where the storage gate 104 is formed. By increasing the bias applied to the substrate, oxygen can be introduced more deeply. Oxygen may be introduced by ion implantation.

Oxygen (an oxygen radical, an oxygen atom, and/or an oxygen ion) with which the storage gate 104 is doped by a plasma doping method may be supplied from a plasma generation apparatus with the use of a gas containing oxygen or from an ozone generation apparatus. Specifically, for example, oxygen can be generated with an apparatus for etching treatment on a semiconductor device, an apparatus for ashing on a resist mask, or the like to process the storage gate 104.

By introduction of oxygen into the storage gate 104, the storage gate 104 (an oxide semiconductor) containing excessive oxygen is formed. When oxygen is introduced into the oxide semiconductor layer, a hydrogen atom is abstracted from an M—H bond to form an M—OH group.

That is, by the introduction of oxygen, a bond between a metal and hydrogen contained in the oxide semiconductor or a bond between the oxygen and hydrogen of a hydroxyl group on the metal is cleaved to produce water. In particular, oxygen having an unpaired electron easily reacts with hydrogen remaining in the oxide semiconductor to produce water. Consequently, hydrogen or a hydroxyl group which is an impurity can be easily eliminated as water by heat treatment performed later.

After the introduction of oxygen into the storage gate 104, second heat treatment is performed (preferably at a temperature of higher than or equal to 200° C. and lower than or equal to 600° C., for example, at a temperature of higher than or equal to 250° C. and lower than or equal to 550° C.). For example, the second heat treatment is performed at 450° C. for one hour in a nitrogen atmosphere. It is preferable that the above atmosphere do not contain water, hydrogen, or the like.

Through the above steps, dehydration or dehydrogenation of the oxide semiconductor layer can be performed with the introduction of oxygen and the heat treatment, whereby remaining impurities containing a hydrogen atom (e.g., hydrogen, water, a hydroxyl group, or a hydride (also referred to as a hydrogen compound)), which cannot be removed completely in the first heat treatment, can be removed from the storage gate 104. Further, it is possible to supply oxygen, which is one of the main components of the oxide semiconductor and is reduced at the same time as a step for removing impurities, so that the oxide semiconductor layer can be made to be intrinsic (i-type). In addition, defects generated at the interface between the storage gate 104 and the insulating layer in contact with the storage gate 104 can be reduced. In such a manner, the oxide semiconductor used for the storage gate 104 can be purified to be an electrically intrinsic oxide semiconductor.

Figure 6C:
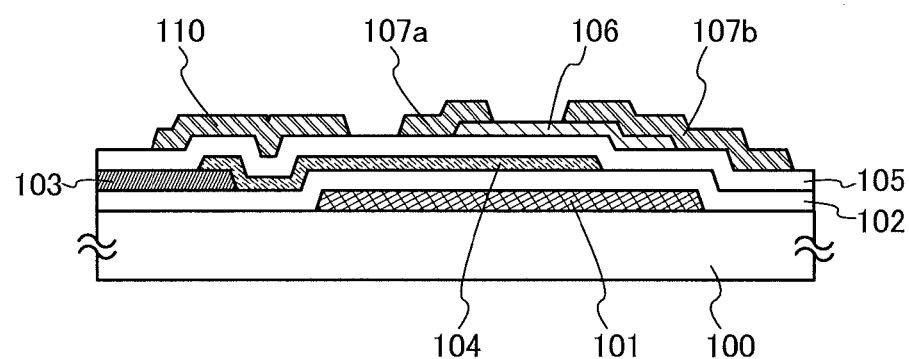

Then, the second gate insulating layer 105 is formed to cover the storage gate 104 and the electrode 103 (see FIG. 6C). The second gate insulating layer 105 can be formed using a material and a method which are similar to those of the first gate insulating layer 102.

Next, a semiconductor layer is formed over the second gate insulating layer 105. Then, through a fourth photolithography process, the semiconductor layer is partly removed by etching, thereby forming the island-shaped semiconductor layer 106 in which a channel of the transistor 150 is formed. For the semiconductor layer 106, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide. The transistor 150 including such a semiconductor material can operate at sufficiently high speed, so that stored data can be read at high speed, for example. In other words, high-speed operation of the semiconductor device can be realized.

Alternatively, an oxide semiconductor can be used for the semiconductor layer 106. The oxide semiconductor can be formed using a material and a method which are similar to those of the storage gate 104. The oxide semiconductor is preferably purified to be i-type by sufficient removal of impurities such as hydrogen or sufficient supply of oxygen. Specifically, the concentration of hydrogen in the oxide semiconductor layer is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower, for example. Note that the above hydrogen concentration of the oxide semiconductor layer was measured by secondary ion mass spectrometry (SIMS).

The oxide semiconductor purified by a sufficient reduction in hydrogen concentration, in which defect levels in the energy gap due to oxygen deficiency are reduced as a result of sufficient supply of oxygen, has a carrier concentration of less than $1 \times 10^{12}$/cm$^3$, preferably less than $1 \times 10^{11}$/cm$^3$, further preferably less than $1.45 \times 10^{10}$/cm$^3$. For example, the off-state current (per unit channel width (1 μm) here) at room temperature (25° C.) is 100 zA/μm (1 zA (zeptoampere) is $1 \times 10^{-21}$ A) or lower, preferably 10 zA/μm or lower. The off-state current at 85° C. is 100 zA/μm ($1 \times 10^{-19}$ A/μm) or lower, preferably 10 zA/μm ($1 \times 10^{-20}$ A/μm) or lower. The transistor 150 with extremely low off-state current characteristics can be obtained with the use of such an oxide semiconductor that is made to be intrinsic (i-type) or substantially intrinsic.

Next, a conductive layer serving as the second control gate 110, the source electrode, and the drain electrode (as well as a wiring formed from the conductive layer) is formed over the second gate insulating layer 105 and the semiconductor layer 106. The conductive layer used for the second control gate 110 and the source and drain electrodes can be formed using a material and a method which are similar to those of the electrode 103. Further, the conductive layer used for the second control gate 110 and the source and drain electrodes may be formed using a conductive metal oxide. Examples of the conductive metal oxide are indium oxide (In$_2$O$_3$), tin oxide (SnO$_2$), zinc oxide (ZnO), a mixed oxide of indium oxide and tin oxide (In$_2$O$_3$—SnO$_2$, referred to as ITO), a mixed oxide of indium oxide and zinc oxide (In$_2$O$_3$—ZnO), and any of these metal oxide materials containing silicon oxide.

Through a fifth photolithography process, a resist mask is formed over the conductive layer, selective etching is performed to form the second control gate 110, the source electrode 107a and the drain electrode 107b, and the resist mask is removed. Note that a resist mask may be formed by an inkjet method, in which case manufacturing costs can be reduced because a photomask is not used.

Figure 6D:
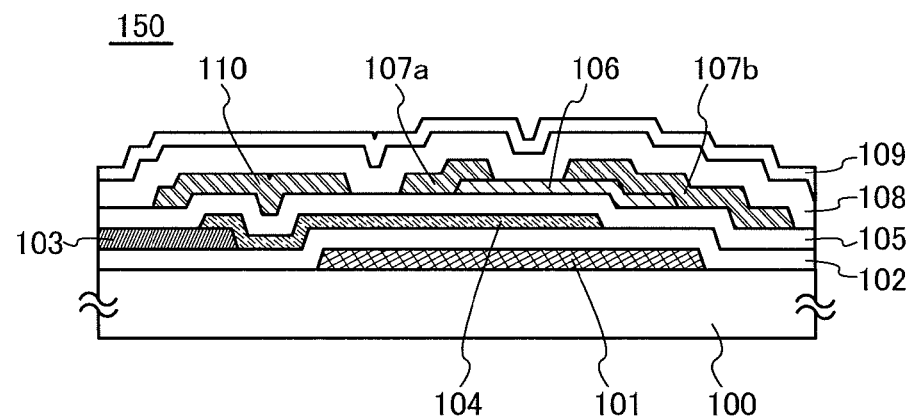

Next, the insulating layer 108 is formed over the semiconductor layer 106, the second control gate 110, the source electrode 107a, and the drain electrode 107b (see FIG. 6D). The insulating layer 108 can be formed using a material and a method which are similar to those of the first gate insulating layer 102. Sputtering is preferably employed for forming the insulating layer 108 in terms of low possibility of entry of hydrogen, water, and the like. If hydrogen is contained in the insulating layer 108, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, it is important to form the insulating layer 108 by a method by which hydrogen and an impurity containing hydrogen are not contained therein.

For the insulating layer 108, an inorganic insulating material such as silicon oxide, silicon oxynitride, hafnium oxide, aluminum oxide, or gallium oxide can be typically used. Gallium oxide is a material that is hardly charged, and thus can suppress variation in threshold voltage due to charge build-up of the insulating layer. Note that in the case where an oxide semiconductor is used for the semiconductor layer 106, a metal oxide layer containing the same kind of component as the oxide semiconductor may be formed as the insulating layer 108 or stacked over the insulating layer 108.

In this embodiment, a 200-nm-thick silicon oxide layer is formed as the insulating layer 108 by sputtering. The substrate temperature in film formation is higher than or equal to room temperature and lower than or equal to 300° C. and is 100° C. in this embodiment. The silicon oxide layer can be formed by sputtering in a rare gas (typically argon) atmosphere, an oxygen atmosphere, or a mixed atmosphere of a rare gas and oxygen. As a target, a silicon oxide target or a silicon target can be used. For example, a silicon oxide layer can be formed by sputtering in an atmosphere containing oxygen with the use of silicon for the target.

In order to remove remaining moisture from the deposition chamber at the time of formation of the insulating layer 108, an entrapment vacuum pump (e.g., a cryopump) is preferably used. When the insulating layer 108 is formed in the deposition chamber evacuated using a cryopump, the impurity concentration in the insulating layer 108 can be reduced. In addition, as an exhaustion unit for removing moisture remaining in the chamber used for depositing the insulating layer 108, a turbo molecular pump provided with a cold trap may be used.

It is preferable that a high-purity gas from which impurities such as hydrogen, water, a compound containing a hydroxyl group, and a hydride are removed be used as a sputtering gas for forming the insulating layer 108.

Then, third heat treatment may be performed in a reduced pressure atmosphere, an inert gas atmosphere, an oxygen gas atmosphere, or an ultra-dry air (preferably at a temperature of higher than or equal to 200° C. and lower than or equal to 600° C., for example, a temperature of higher than or equal to 250° C. and lower than or equal to 550° C.). For example, the third heat treatment may be performed at 450° C. for one hour in a nitrogen atmosphere. The third heat treatment is performed while part of the oxide semiconductor layer (a channel formation region) is in contact with the insulating layer 108. It is preferable that the above atmosphere do not contain water, hydrogen, or the like.

In the case where the semiconductor layer 106 is formed using an oxide semiconductor, when heat treatment is performed in a state where the semiconductor layer 106 is in contact with the insulating layer 108 containing oxygen, oxygen can be supplied to the semiconductor layer 106 from the insulating layer 108 containing oxygen. Note that the insulating layer 108 containing oxygen is preferably an insulating layer including an oxygen excess region.

Through the above process, the transistor 150 is formed. The protective insulating layer 109 may be further formed over the insulating layer 108. The protective insulating layer 109 is preferably formed using a material which hardly contains impurities such as moisture, a hydrogen ion, or OH⁻ and has a high barrier property against an alkali metal, hydrogen, and oxygen. Specifically, the protective insulating layer 109 is preferably formed using silicon nitride, silicon nitride oxide, aluminum nitride, aluminum oxide, aluminum oxynitride, or the like. In this embodiment, the protective insulating layer 109 is formed using aluminum oxide (see FIG. 6D).

Aluminum oxide used for the protective insulating layer 109 is formed in the following manner: the substrate 100 over which layers up to and including the insulating layer 108 are formed is heated at a temperature ranging from 100° C. to 400° C., a sputtering gas containing high-purity oxygen from which hydrogen and moisture are removed is introduced, and an aluminum target is used. Like the insulating layer 108, the protective insulating layer 109 is preferably deposited while moisture remaining in a treatment chamber is removed.

The protective insulating layer 109 is preferably formed in contact with the first gate insulating layer 102 or a base layer (not shown) which are placed below the protective insulating layer 109, and prevents entry of impurities such as moisture, a hydrogen ion, or OH⁻ from the vicinity of an edge portion of the substrate. In addition, elimination of oxygen from the oxide semiconductor layer can be prevented.

After the transistor 150 is formed, heat treatment may be further performed at a temperature of higher than or equal to 100° C. and lower than or equal to 200° C. for longer than or equal to one hour and shorter than or equal to 30 hours in the air. This heat treatment may be performed at a fixed heating temperature. Alternatively, it is possible that the following change in temperature is set as one cycle and repeated plural times: the temperature is increased from room temperature to a heating temperature and then decreased to room temperature.

Alternatively, without performing the first heat treatment, the second heat treatment may be performed under the conditions of the first heat treatment.

Note that in the transistor 150, edges of the control gate 101, the electrode 103, the source electrode 107a, and the drain electrode 107b are preferably tapered. Here, the taper angle is greater than or equal to 30° and less than or equal to 60°, for example. Note that the taper angle refers to an inclination angle formed by a side surface and a bottom surface of a layer when the layer is observed from the direction perpendicular to the cross section of the layer (i.e., the plane perpendicular to the surface of the substrate). When the edges of the control gate 101, the electrode 103, the source electrode 107a, and the drain electrode 107b are tapered, coverage thereof with a layer formed in a following step can be improved and a break of the layer due to a step can be prevented.

Figure 7A:
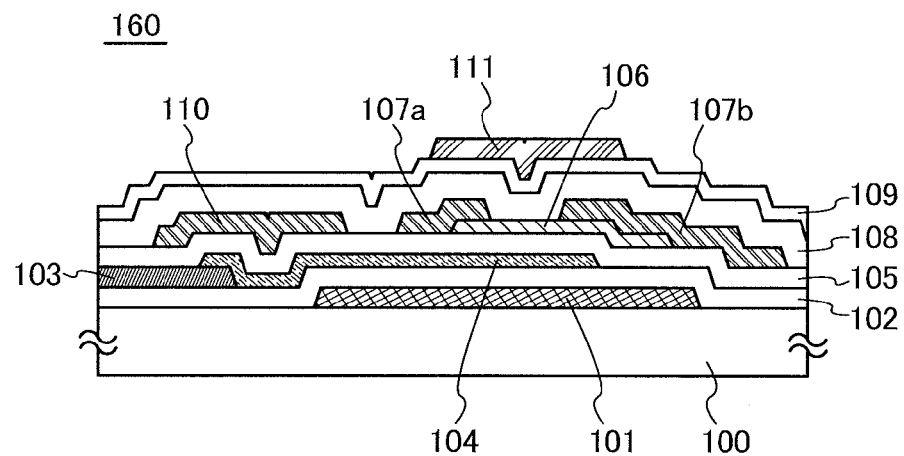
FIGS. 7A and 7B are cross-sectional views of semiconductor devices.

FIG. 7A illustrates a transistor 160 as a structural example of the case where a back gate 111 is formed in the transistor 150. The back gate 111 is positioned so that the channel formation region of the semiconductor layer 106 is placed between the first control gate 101 and the back gate 111. The back gate 111 can be formed using a material and a method similar to those of the first control gate 101, the source electrode 107a, the drain electrode 107b, and the like.

In FIG. 7A, the back gate 111 is formed over the channel formation region of the semiconductor layer 106 with the insulating layer 108 and the protective insulating layer 109 placed therebetween. FIG. 7A illustrates the example in which the back gate 111 is formed over the protective insulating layer 109; alternatively, the back gate 111 may be formed between the insulating layer 108 and the protective insulating layer 109.

The back gate 111 may be connected to one of the source electrode 107a and the drain electrode 107b, or may be connected nowhere and electrically floating (in a floating state). The placement of the back gate 111 can reduce variations in characteristics which are caused when a plurality of transistors are formed in the semiconductor device, and realize high stability in operation of the semiconductor device.

The oxide semiconductor used for the semiconductor layer in this embodiment is an intrinsic (i-type) oxide semiconductor or a substantially intrinsic oxide semiconductor. The intrinsic (i-type) oxide semiconductor or substantially intrinsic oxide semiconductor is obtained in such a manner that hydrogen having the property as a donor is removed from an oxide semiconductor as much as possible, the oxide semiconductor is purified so as to contain impurities as little as possible, and oxygen is then supplied to the oxide semiconductor and oxygen deficiency in the oxide semiconductor is reduced. That is, the oxide semiconductor layer used in the above transistor is an oxide semiconductor layer that is made to be electrically intrinsic.

The number of carriers in the purified and electrically intrinsic oxide semiconductor is very small (close to zero), and the carrier concentration can be lower than $1\times10^{14}/cm^3$, preferably lower than $1\times10^{12}/cm^3$, further preferably lower than $1\times10^{11}/cm^3$.

Note that the amount of oxygen is preferably in excess of stoichiometry in the oxide semiconductor. When the amount of oxygen is in excess of stoichiometry, generation of carriers which results from oxygen deficiency in the oxide semiconductor can be suppressed.

Since the number of carriers in the oxide semiconductor is extremely small, the off-state current of a transistor in which the oxide semiconductor is used in its channel formation region can be reduced. The smaller amount of off-state current is more preferable.

Specifically, in a transistor in which the above oxide semiconductor is used for a channel formation region, the value of the off-state current per unit channel width (1 μm) at room temperature can be 10 aA/μm ($1\times10^{-17}$ A/μm) or lower, further reduced to 1 aA/μm ($1\times10^{-18}$ A/μm) or lower, still further reduced to 1 zA/μm ($1\times10^{-21}$ μm) or lower, and still further reduced to 1 yA/μm ($1\times10^{-24}$ A/μm) or lower.

In addition, the on-state current of the transistor including the above oxide semiconductor in the channel formation region has almost no temperature dependence, and variation in off-state current is extremely small.

Furthermore, the transistor including the above oxide semiconductor in the channel formation region can be a highly reliable transistor in which the amount of change in the threshold voltage of the transistor by external stimuli (e.g., those in a bias-temperature stress (BT) test) can be reduced.

The transistor including the above oxide semiconductor can have relatively high field-effect mobility and thus can operate at high speed.

As described above, a semiconductor device that includes an oxide semiconductor and has stable electric characteristics can be provided. Therefore, a semiconductor device with high reliability can be provided.

Figure 7B:
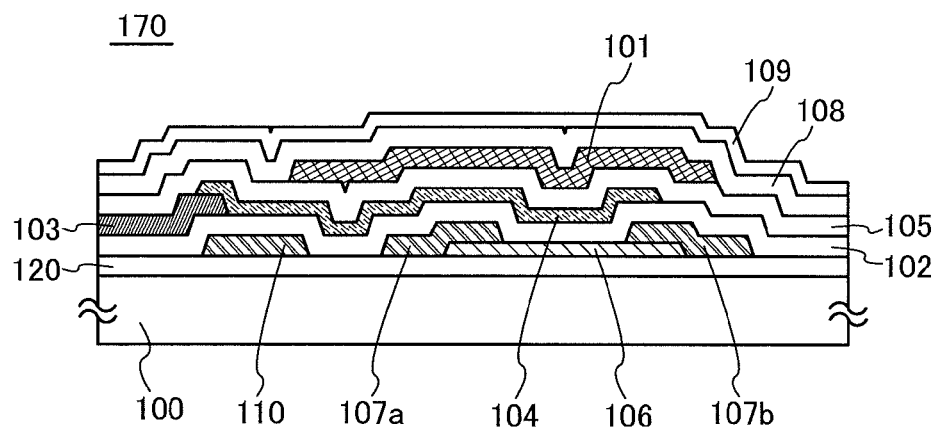

Note that the method for manufacturing the bottom-gate transistor is described as an example in this embodiment; however, the transistor in this embodiment is not limited to having a bottom-gate structure. A transistor 170 illustrated in FIG. 7B is an example of a top-gate transistor. Although the positions of the first control gate 101 and the semiconductor layer 106 which are stacked and the like are different from those in the transistor 150, the transistor 170 can be formed using a material and a method similar to those of the transistor 150.

In the transistor 170, a base layer 120 is provided between the substrate 100 and the semiconductor layer 106. In the case where the back gate 111 is provided in the transistor 170, the back gate 111 can be provided, for example, between the substrate 100 and the base layer 120 so as to overlap with the semiconductor layer 106.

Since the semiconductor layer 106 can be provided as the bottom layer in the top-gate transistor, when a single crystal substrate such as a silicon wafer is used as the substrate 100, part of the single crystal substrate can be easily used as the semiconductor layer 106.

This embodiment can be implemented in combination with the other embodiments as appropriate.

Embodiment 3

In this embodiment, a circuit configuration and its operation which are different from those described in Embodiment 1 are described with reference to FIGS. 8A and 8B and FIGS. 9A and 9B. In this embodiment, the case where an n-channel transistor is used will be described. The same portions as those in Embodiment 1 and portions having functions similar to those of the portions in Embodiment 1 and steps similar to those in Embodiment 1 may be employed as in Embodiment 1, and repeated description and detailed description of the same portions are basically omitted.

Figure 8A:
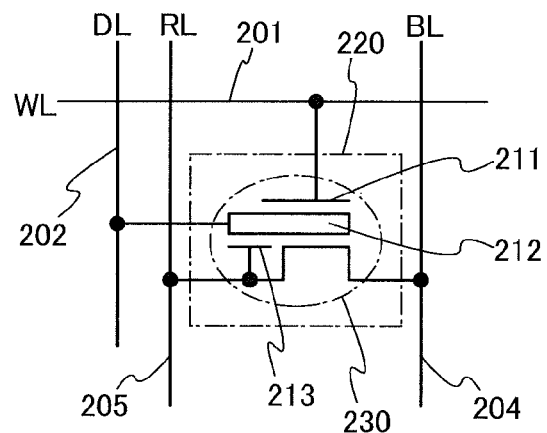
FIGS. 8A and 8B are circuit diagrams of a semiconductor device.

FIG. 8A illustrates a circuit configuration of a non-volatile memory cell 220 including a transistor 230. In the transistor 210 described in Embodiment 1, the second control gate 213 is connected to the control line CL; in this embodiment, the third wiring 203 (the control line CL) is not provided and the second control gate 213 is connected to the fifth wiring 205 (the read signal line RL).

The number of wirings per unit memory cell is reduced in the memory cell 220 in this embodiment as compared to the memory cell 200 described in Embodiment 1. Therefore, the area per unit memory cell can be further reduced and integration of the memory cells can be further increased.

Next, a write operation and a read operation of a semiconductor device disclosed in this embodiment are specifically described with reference to timing charts of FIGS. 9A and 9B. The timing charts of FIGS. 9A and 9B show changes over time in potentials or states of the components illustrated in FIGS. 8A and 8B. Note that the values of the potentials supplied to the wirings and the threshold voltage of the transistor 230 are the same as those in Embodiment 1.

First, a write (rewrite) operation of data into the memory cell 220 will be described. Here, an operation for holding the high-level potential $V_{MLH}$ in the storage gate 212 in the case of using an n-channel transistor as the transistor 230 is described. First, as a first operation, the high-level potential $V_{WLH}$, the high-level potential $V_{RLH}$, and the high-level potential $V_{DLH}$ are respectively applied to the first wiring 201 (the word line WL), the fifth wiring 205 (the read signal line RL), and the second wiring 202 (the data line DL) which are connected to the memory cell 220 that is selected to be subjected to data writing.

When the high-level potential $V_{WLH}$ is applied to the first wiring 201 (the word line WL), the potential of the first control gate 211 becomes the high-level potential $V_{WLH}$. When the high-level potential $V_{RLH}$ is applied to the fifth wiring 205 (the read signal line RL), the potential of the second control gate 213 becomes the high-level potential $V_{RLH}$. Accordingly, the potential difference between the second wiring 202 (the data line DL) and the first control gate 211, with the second wiring 202 (the data line DL) as a reference, becomes 3 V; the potential difference between the second wiring 202 (the data line DL) and the second control gate 213, with the second wiring 202 (the data line DL) as a reference, becomes 2 V. In other words, both the potential differences are more than $V_{thos}$ (1 V); thus, the entire storage gate 212 becomes a conductor, the potential of the second wiring 202 (the data line DL) is supplied to the storage gate 212, and the potential of the storage gate 212 becomes the high-level potential $V_{DLH}$.

In the write operation, there is no particular limitation on the potential of the fourth wiring 204 (the bit line BL); here, the potential is 0 V.

Then, as a second operation, the low-level potential $V_{WLL}$ is applied to the first wiring 201 (the word line WL) and the low-level potential $V_{RLL}$ is applied to the fifth wiring 205 (the read signal line RL). At this time, the potential of the second wiring 202 (the data line DL) is set to remain at the high-level potential $V_{DLH}$. When the low-level potentials are applied to the first wiring 201 (the word line WL) and the fifth wiring 205 (the read signal line RL), the potentials of the first control gate 211 and the second control gate 213 become the low-level potential. Accordingly, the potential difference between the second wiring 202 (the data line DL) and the first control gate 211, with the second wiring 202 (the data line DL) as a reference, and the potential difference between the second wiring 202 (the data line DL) and the second control gate 213 with the second wiring 202 (the data line DL) as a reference, become less than $V_{thos}$ (1 V) and the storage gate 212 becomes an insulator.

Since a voltage that makes the storage gate 212 become n-type is 1 V at this time, the potential of the storage gate 212 is the high-level potential $V_{DLH}$ as long as the potential difference between the second wiring 202 (the data line DL) and the first wiring 201 (the control gate 211) is 1 V or more; when the potential difference is less than 1 V, the storage gate 212 becomes an insulator. As a result of the change in the potential of the first wiring 201 (the word line WL), the potential of the insulated storage gate 212 becomes $V_{DLH}$–1 V–$V_{WLL}$. That is, the potential of the insulated storage gate 212 becomes –1 V (the high-level potential $V_{MLH}$) in this embodiment.

When the storage gate 212 becomes an insulator, electric charge in the storage gate 212 cannot move; therefore, the potential of the storage gate 212 remains at the high-level potential $V_{MLH}$ even when the potential of the second wiring 202 is changed. Thus, the data can be stored in the storage gate 212.

The operation for holding the low-level potential $V_{MLL}$ in the storage gate 212 can be understood with $V_{DLH}$ replaced with $V_{DLL}$ in FIG. 9A under the above-described operation principle.

Both the high-level potential $V_{MLH}$ and the low-level potential $V_{MLL}$ which are stored in the storage gate 212 are a potential at which the transistor 230 is off. When the potential which is stored in the storage gate 212 is a potential at which the transistor 230 is off, unintended reading of data from another memory cell in the case where a plurality of memory cells 220 are connected is prevented and data can be accurately read, resulting in improvement in the reliability of the semiconductor device.

The high-level potential $V_{RLH}$ is set at a potential higher than the potential that makes the storage gate 212 a conductor and the low-level potential $V_{RLL}$ is set at a potential lower than the potential that makes the storage gate 212 an insulator, whereby the potential of the fifth wiring 205 (the read signal line RL) makes the region of the storage gate 212 which overlaps with the second control gate a conductor or an insulator.

Next, an operation of reading data stored in the memory cell 220 will be described. FIG. 9B is a timing chart of the operation in the read mode. Here, an operation in the case where the high-level potential $V_{MLH}$ is held in the storage gate 212 is described.

First, as a first operation, the fourth wiring 204 (the bit line BL) is supplied with (precharged with) electric charge, so that the potential of the fourth wiring 204 (the bit line BL) is set at the high-level potential $V_{BLH}$. Note that the high-level potential $V_{BLH}$ and the low-level potential $V_{RLL}$ are different from each other. At this time, each of the potentials of the first wiring 201 (the word line WL) and the fifth wiring 205 (the read signal line RL) is set to remain at the low-level potential. There is no particular limitation on the potential of the second wiring 202 (the data line DL); here, the second wiring 202 has the high-level potential $V_{DLH}$.

Then, as a second operation, the potential of the fifth wiring 205 (the read signal line RL) is set to remain at the low-level potential $V_{RLL}$ and the potential of the first wiring 201 (the word line WL) is set at the high-level potential $V_{WLH}$. Since the high-level potential $V_{MLH}$ held in the storage gate 212 is –1 V and the low-level potential $V_{RLL}$ is 0 V at this time, the gate-source voltage is as follows: $V_{WLH}+V_{MLH}-V_{RLL}=3$ V+(–1 V)–0 V=2 V. That is, the gate-source voltage is higher than or equal to the threshold voltage (which is 1 V in this embodiment) of the transistor 230; thus, the transistor 230 is turned on. When the transistor 230 is turned on, the potential of the fifth wiring 205 (the read signal line RL) is supplied to the fourth wiring 204 (the bit line BL) through the transistor 230, so that the potential of the fourth wiring 204 (the bit line BL) is changed.

In the case where the low-level potential $V_{MLL}$ is stored in the storage gate 212, the gate-source voltage ($V_{WLH}+V_{MLL}-V_{RLL}=3$ V+(–3 V)–0 V=0 V) cannot exceed the threshold voltage of the transistor 230 even when the potential of the first wiring 201 (the word line WL) is set at the high-level potential $V_{WLH}$. In that case, the transistor 230 remains off, and the potential of the fourth wiring 204 is not changed. In such a manner, data stored in the storage gate 212 can be read by detecting a change in the potential of the fourth wiring 204 (the bit line BL) when the potential of the fifth wiring 205 (the read signal line RL) is the low-level potential $V_{RLL}$.

In a read operation, by setting the potential of the fifth wiring 205 (the read signal line RL) at the low-level potential $V_{RLL}$, a region of the storage gate 212, which overlaps with the second control gate 213, remains to be an insulator. Thus, the potential of the first wiring 201 (the word line WL) becomes the high-level potential $V_{WLH}$ and the potential of the second wiring 202 (the data line DL) does not affect the storage gate 212 even when a region of the storage gate 212, which overlaps with the first control gate 211, becomes a conductor. In other words, by setting the potential of the fifth wiring 205 (the read signal line RL) at the low-level potential $V_{RLL}$, the storage gate 212 can retain the stored data even when the potentials of the second wiring 202 (the data line DL) and the first wiring 201 (the word line WL) are changed.

As described above, data (electric charge) held in the storage gate 212 is retained until the data is rewritten with new data in a write mode. The insulated oxide semiconductor has high resistivity and electric charge hardly moves therein; thus, the potential of the storage gate 212 can be retained for an extremely long time.

Figure 8B:
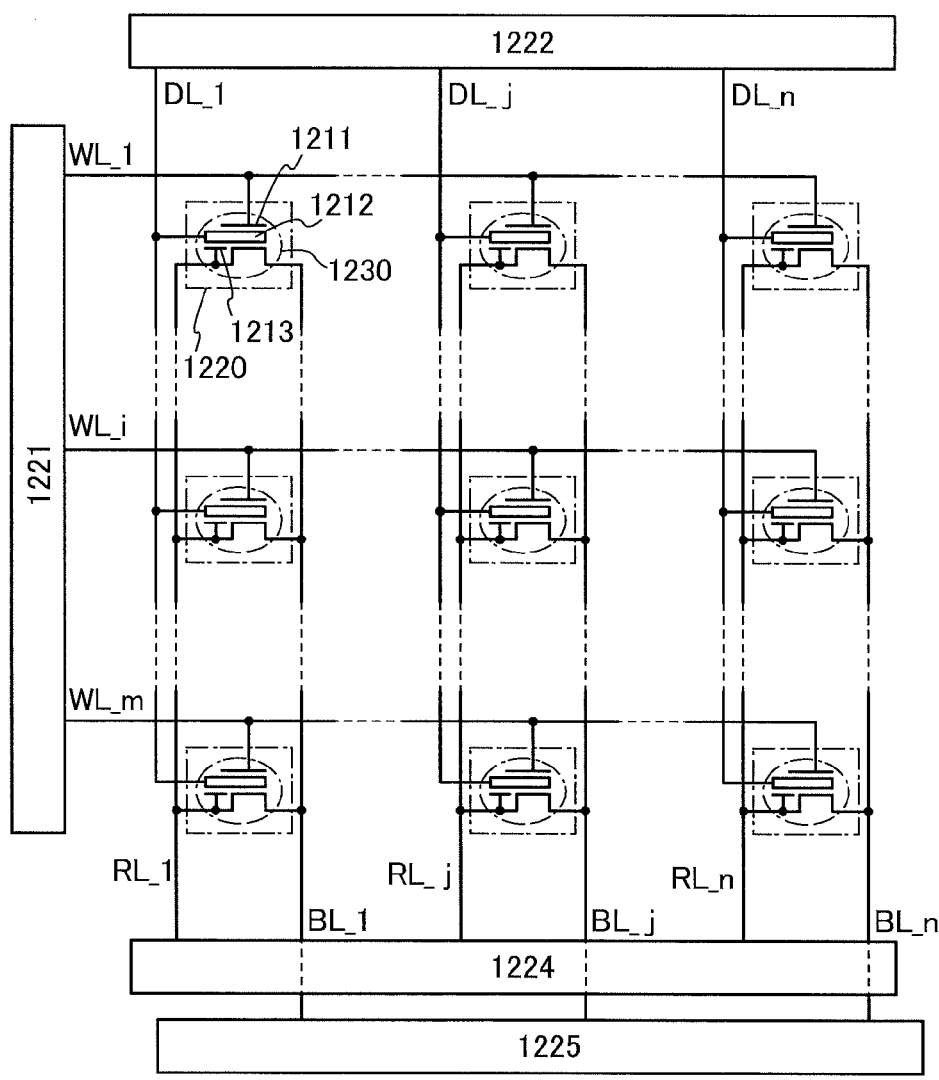

FIG. 8B illustrates an example of a circuit diagram of a semiconductor device with a memory capacity of m×n bits, including the semiconductor devices (the memory cells) illustrated in FIG. 8A. FIG. 8B is a circuit diagram of a NOR semiconductor device in which memory cells 1220 are connected in parallel.

The semiconductor device illustrated in FIG. 8B includes a memory cell array and peripheral circuits such as the first driver circuit 1221, the second driver circuit 1222, the fourth driver circuit 1224, and the fifth driver circuit 1225. The memory cell array includes m word lines WL, n data lines DL, n read signal lines RL, n bit lines BL, and a plurality of memory cells 1220 that are arranged in a matrix of m rows (in the vertical direction) and n columns (in the horizontal direction) (m and n are natural numbers). Here, the structure illustrated in FIG. 1A is applied to the memory cell 1220.

Each of the memory cells 1220 includes a transistor 1230. The transistor 1230 has the first control gate 1211, the second control gate 1213, and the storage gate 1212. The first control gate 1211 is electrically connected to the word line WL. The second control gate 1213 is electrically connected to the read signal line RL. The storage gate 1212 is electrically connected to the data line DL. One of a source and a drain of the transistor 1210 is electrically connected to the read signal line RL. The other of the source and the drain of the transistor 1210 is electrically connected to the bit line BL.

A memory cell 1220 (i,j) of an i-th row and a j-th column (i is an integer which is greater than or equal to 1 and less than or equal to m and j is an integer which is greater than or equal to 1 and less than or equal to n) is electrically connected to a data line DL_j, a read signal line RL_j, a bit line BL_j, and a word line WL_i.

The word lines WL are electrically connected to the first driver circuit 1221. The data lines DL are electrically connected to the second driver circuit 1222. The read signal lines RL are electrically connected to the fourth driver circuit 1224. The bit lines BL are electrically connected to the fifth driver circuit 1225.

The memory cell 1220 in this embodiment has a structure in which the control line CL of the memory cell 1200 described in Embodiment 1 is omitted. Therefore, the second driver circuit 1223 is not necessarily provided, in which case the semiconductor device can be more highly integrated and improvement in yield of the semiconductor device and a reduction in cost can be achieved. Note that the first driver circuit 1221, the second driver circuit 1222, the fourth driver circuit 1224, and the fifth driver circuit 1225 are separately provided here; alternatively, a decoder having one or a plurality of their functions may be used.

Although data can be written into the memory cell 1220 with the above-described write operation, when $V_{WLH}$ is applied to a word line WL, the storage gates of the all the transistors 1230 connected to the word line WL become conductors. In view of this problem, in the write operation, the potential of the read signal line RL connected to the memory cell 1220 subjected to data writing is set at the high-level potential $V_{RLH}$ and the potential of the read signal line RL connected to the memory cell 1220 not subjected to data writing is set at the low-level potential $V_{RLL}$, whereby data which is stored in the memory cell 1220 not subjected to data writing is prevented from being rewritten unintentionally.

By setting the potential of the word line WL which is connected to the memory cell 1220 not subjected to data writing at the low-level potential $V_{WLL}$, the data in the memory cell 1220 not subjected to data writing can be prevented from being rewritten even when the potential of the read signal line RL connected to the memory cell 1220 not subjected to data writing becomes the high-level potential $V_{RLH}$.

Data can be written into only one memory cell which is connected to the selected word line WL; data can also be written into a plurality of or all of the memory cells at the same time as long as the memory cells are connected to the selected word line WL.

Data can be read from the memory cell 1220 with the above-described read operation. In the read operation, the potentials of all the read signal lines RL are set at the low-level potential $V_{RLL}$, which prevents unintended rewriting of data in the memory cell which is not subjected to data reading and is connected to the word line WL selected for data reading. Further, in order to prevent data in a memory cell not subjected to data reading from being unintentionally read, the potential of the word line WL other than the word line WL selected for data reading is set at the low-level potential $V_{WLL}$.

Note that data reading can be performed in only one memory cell or a plurality of or all of the memory cells at the same time as long as the memory cells are connected to the selected word line WL.

Note that an n-channel transistor (n-type transistor) in which electrons are majority carriers is used in the above description; a p-channel transistor in which holes are majority carriers can be used instead of the n-channel transistor. In the case of using p-channel transistors, potentials supplied to the wirings are set under the above-described operation principle.

The structures described in this embodiment can be combined as appropriate with any of the structures described in the other embodiments.

Embodiment 4

In this embodiment, an example of a structure of the semiconductor device described in Embodiment 3 will be described with reference to FIGS. 10A to 10C.

<Cross-Sectional Structure and Planar Structure of Semiconductor Device>

Figure 10A:
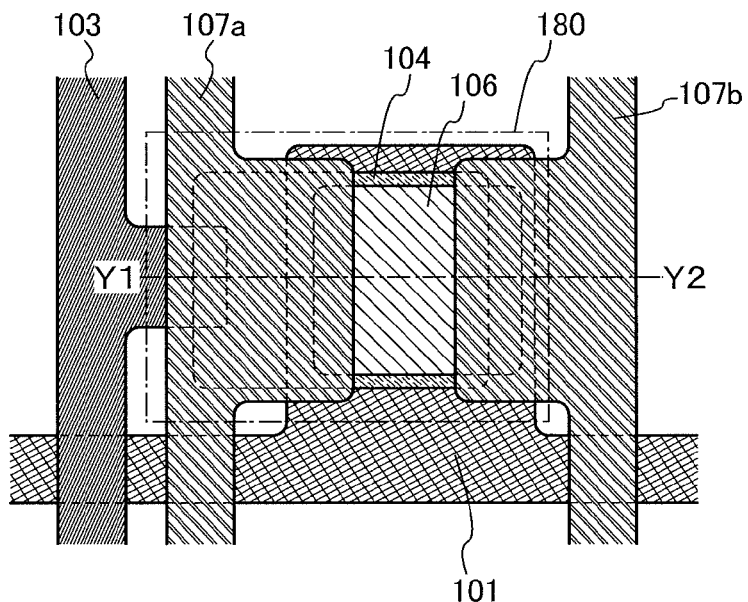
FIG. 10A is a plan view and FIGS. 10B and 10C are cross-sectional views of a semiconductor device.
Figure 10B:
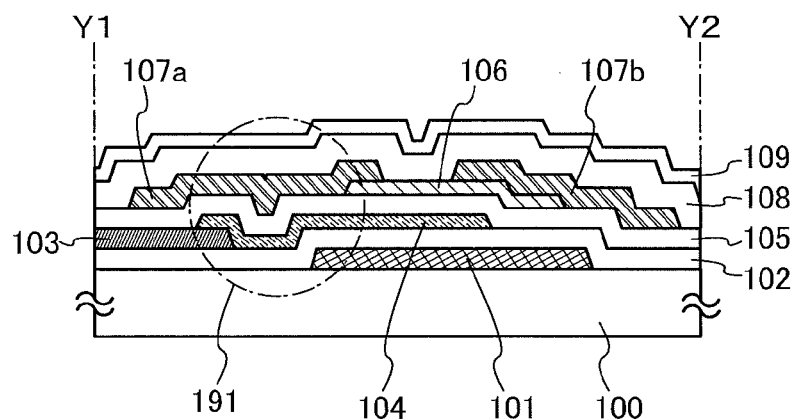
Figure 10C:
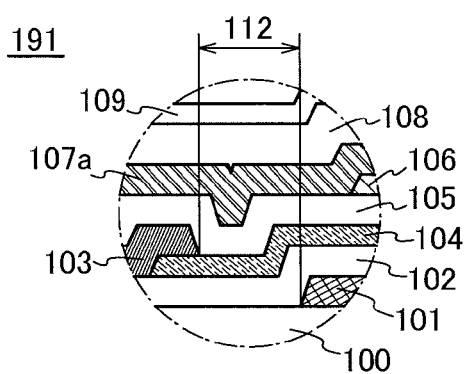

FIGS. 10A to 10C illustrate an example of a transistor that can be used as a storage element. FIG. 10A illustrates a planar structure of a transistor 180. FIG. 10B illustrates a cross section along Y1-Y2 in FIG. 10A. FIG. 10C is an enlarged view of a portion 191 in FIG. 10B.

In the transistor 180, the first control gate 101 is provided over the substrate 100. The first gate insulating layer 102 is provided over the first control gate 101. The electrode 103 is provided over the first gate insulating layer 102. The storage gate 104 is provided in contact with the first gate insulating layer 102 and the electrode 103. The second gate insulating layer 105 is provided over the storage gate 104. The semiconductor layer 106 is provided over the second gate insulating layer 105. The source electrode 107a and the drain electrode 107b are provided over the semiconductor layer 106.

The insulating layer 108 is provided over the semiconductor layer 106, the source electrode 107a, and the drain electrode 107b. The protective insulating layer 109 is provided over the insulating layer 108. The transistor 180 has a bottom-gate structure and an inverted staggered structure.

Although not shown, the first control gate 101 is electrically connected to the word line WL, the source electrode 107a is electrically connected to the read signal line RL, the drain electrode 107b is electrically connected to the bit line BL, and the electrode 103 is electrically connected to the data line DL. Further, the first control gate 101 corresponds to the first control gate 211.

The electrode 103 is provided in contact with part of the storage gate 104 and supplies data to be stored to the storage gate 104. The storage gate 104 is sandwiched between the first gate insulating layer 102 and the second gate insulating layer 105. Moreover, the storage gate 104 is in contact with the first gate insulating layer 102 and the second gate insulating layer 105 at least in a region overlapping with the channel formation region of the semiconductor layer 106 (i.e., the region in the semiconductor layer 106, placed between the source electrode 107a and the drain electrode 107b).

The first control gate 101 is placed to overlap with the storage gate 104 and the channel formation region of the semiconductor layer 106. The storage gate 104 is placed between the first control gate 101 and the semiconductor layer 106. The electrode 103 is placed apart from the first control gate 101 and the channel formation region of the semiconductor layer 106.

In FIG. 10C, a region from the edge of the first control gate 101 to the edge of the electrode 103 is shown enlarged. The storage gate 104 extends beyond the edge of the first control gate 101 and has a region (the offset region 112) which is in contact with the electrode 103. The source electrode 107a extends beyond the edge of the first control gate 101 and is placed to cover the offset region 112 of the storage gate 104 and the edge of the electrode 103.

A region of the source electrode 107a which covers the edge of the first control gate 101, the offset region 112 of the storage gate 104, and the edge of the electrode 103 functions as the second control gate 213.

In the case where data is written into the storage gate 104 with the above structure, accurate data writing can be performed in such a manner that a high-level potential is supplied to the first control gate 101 and the source electrode 107a, and at least a portion of the storage gate 104 from the portion overlapping with the channel formation region of the semiconductor layer 106 to the portion in contact with the electrode 103 is made to be a conductor.

The transistor 180 has the structure of the transistor 150 described in Embodiment 2, from which the second control gate 110 is omitted. The transistor 180 can be manufactured by a method similar to that described in Embodiment 2. The transistor 180 may be provided with a back gate or have a top-gate structure.

This embodiment can be implemented in combination with the other embodiments as appropriate.

Embodiment 5

In this embodiment, examples of an electronic device to which the semiconductor device described in the above embodiment is applied will be described with reference to FIGS. 11A to 11F. Specifically, this embodiment explain applications of the semiconductor device described in the above embodiment to electronic devices such as a computer, a mobile phone handset (also referred to as a mobile phone or a mobile phone device), a personal digital assistant (including a portable game machine and an audio reproducing device), a camera such as a digital camera and a digital video camera, electronic paper, and a television device (also referred to as a television or a television receiver).

Figure 11A:
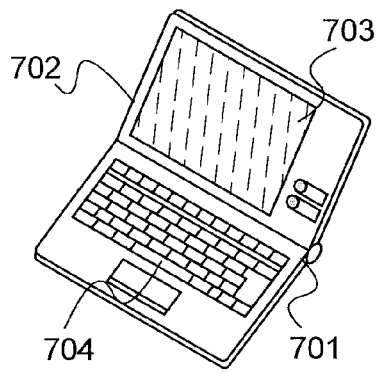
FIGS. 11A to 11F each illustrate an electronic device including a semiconductor device.

FIG. 11A illustrates a laptop personal computer including a housing 701, a housing 702, a display portion 703, a keyboard 704, and the like. The semiconductor device described in the above embodiment is provided in each of the housings 701 and 702. Thus, it is possible to realize a laptop personal computer in which data is written and read at high speed, data can be retained for a long time, and power consumption is sufficiently low.

Figure 11D:
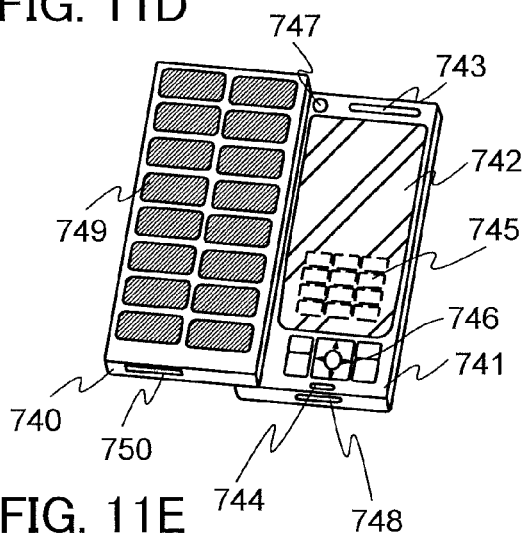
Figure 11B:
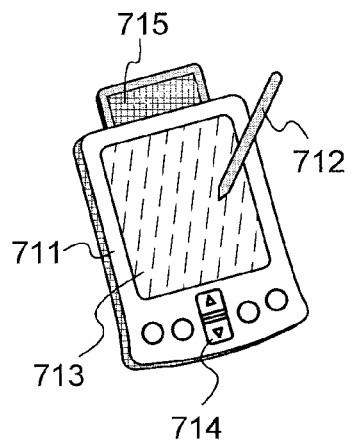

FIG. 11B illustrates a personal digital assistant (PDA). A main body 711 is provided with a display portion 713, an external interface 715, operation buttons 714, and the like. Further, a stylus 712 or the like for operating the personal digital assistant is provided. The semiconductor device described in the above embodiment is provided in the main body 711. Thus, it is possible to realize a personal digital assistant in which data is written and read at high speed, data can be retained for a long time, and power consumption is sufficiently low.

Figure 11E:
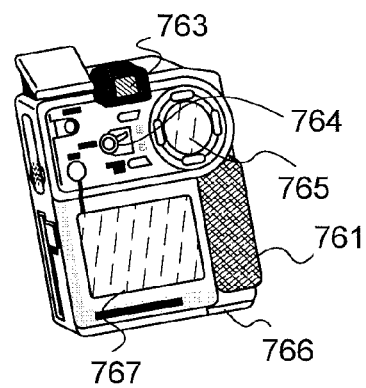
Figure 11C:
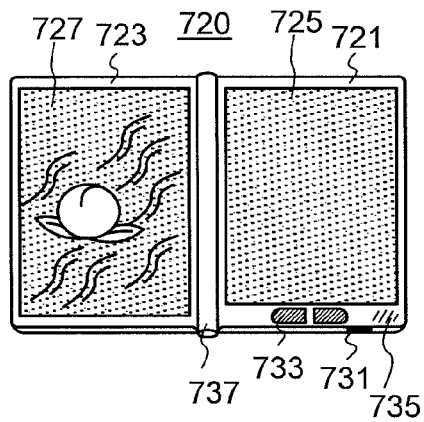

FIG. 11C illustrates an e-book reader 720 including electronic paper, and the e-book reader 720 includes two housings of a housing 721 and a housing 723. The housing 721 and the housing 723 are provided with a display portion 725 and a display portion 727, respectively. The housings 721 and 723 are connected by a hinge portion 737 and can be opened or closed using the hinge portion 737 as an axis. The housing 721 is provided with a power switch 731, an operation key 733, a speaker 735, and the like. At least one of the housings 721 and 723 is provided with the semiconductor device described in the above embodiment. Thus, it is possible to realize an e-book reader in which data is written and read at high speed, data can be retained for a long time, and power consumption is sufficiently low.

FIG. 11D illustrates a mobile phone including two housings of a housing 740 and a housing 741. The housing 740 and the housing 741 developed as illustrated in FIG. 11D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 for charging the mobile phone, an external memory slot 750, and the like. An antenna is incorporated in the housing 741. At least one of the housings 740 and 741 is provided with the semiconductor device described in the above embodiment. Thus, it is possible to realize a mobile phone in which data is written and read at high speed, data can be retained for a long time, and power consumption is sufficiently low.

The display panel 742 is provided with a touch panel. A plurality of operation keys 745 displayed as images are indicated by dashed lines in FIG. 11D. Note that the mobile phone includes a booster circuit for raising a voltage output from the solar cell 749 to a voltage needed for each circuit.

FIG. 11E illustrates a digital camera including a main body 761, a display portion 767, an eyepiece 763, an operation switch 764, a display portion 765, a battery 766, and the like. The semiconductor device described in the above embodiment is provided in the main body 761. Thus, it is possible to realize a digital camera in which data is written and read at high speed, data can be retained for a long time, and power consumption is sufficiently low.

Figure 11F:
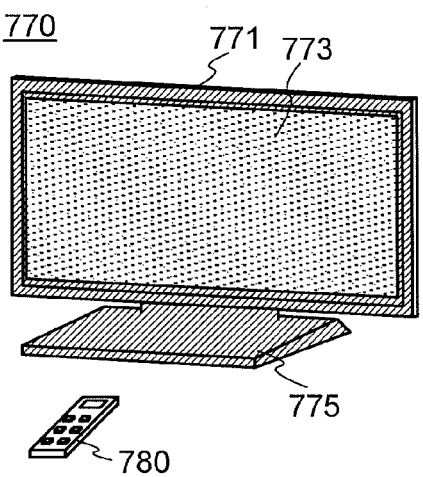

FIG. 11F illustrates a television device 770 including a housing 771, a display portion 773, a stand 775, and the like. The television device 770 can be operated with an operation switch of the housing 771 or a remote controller 780. The housing 771 and the remote controller 780 are each provided with the semiconductor device described in the above embodiment. Thus, it is possible to realize a television device in which data is written and read at high speed, data can be retained for a long time, and power consumption is sufficiently low.

As described above, the electronic devices described in this embodiment each include the semiconductor device described in the above embodiment; thus, electronic devices with low power consumption can be realized.

This application is based on Japanese Patent Application serial no. 2010-169598 filed with Japan Patent Office on Jul. 28, 2010, the entire contents of which are hereby incorporated by reference.

What is claimed is:

1. A semiconductor device comprising:
   a transistor including a first gate, a second gate, a third gate and a semiconductor layer; and
   a data line electrically connected to the third gate,
   wherein the third gate includes an oxide semiconductor,
   wherein the semiconductor layer includes a channel formation region,
   wherein the first gate overlaps with the channel formation region,
   wherein the third gate is provided between the first gate and the channel formation region,
   wherein the third gate includes a first region and a second region, the first region overlapping with the channel formation region, and the second region extending beyond an edge of the first gate, and
   wherein the second gate overlaps with the second region.

2. The semiconductor device according to claim 1, wherein the semiconductor layer comprises an oxide semiconductor.

3. The semiconductor device according to claim 1, wherein the second gate overlaps with the edge of the first gate, the second region, and an edge of the data line.

4. A semiconductor device comprising:
   a transistor including a first control gate, a second control gate, a storage gate and a semiconductor layer;
   a word line;
   a data line;

a control line;
a read signal line; and
a bit line,
wherein the semiconductor layer includes a channel formation region,
wherein the first control gate is electrically connected to the word line,
wherein the second control gate is electrically connected to the control line,
wherein the storage gate is electrically connected to the data line,
wherein one of a source and a drain of the transistor is electrically connected to the read signal line,
wherein the other of the source and the drain is electrically connected to the bit line,
wherein the first control gate overlaps with the channel formation region,
wherein the storage gate is provided between the first control gate and the channel formation region,
wherein the storage gate includes a first region and a second region, the first region overlapping with the channel formation region, and the second region extending beyond an edge of the first control gate, and
wherein the second control gate overlaps with the second region.

5. The semiconductor device according to claim 4, wherein the storage gate comprises an oxide semiconductor.

6. The semiconductor device according to claim 4, wherein the semiconductor layer comprises an oxide semiconductor.

7. The semiconductor device according to claim 4, wherein the second control gate overlaps with the edge of the first control gate, the second region, and an edge of the data line.

8. The semiconductor device according to claim 1, wherein the semiconductor device is one selected from the group consisting of a laptop personal computer, a personal digital assistant, an e-book reader, a mobile phone, a digital camera, and a television device.

9. The semiconductor device according to claim 4, wherein the semiconductor device is one selected from the group consisting of a laptop personal computer, a personal digital assistant, an e-book reader, a mobile phone, a digital camera, and a television device.

* * * * *